(12) United States Patent
Ishii et al.

(10) Patent No.: US 9,042,147 B2
(45) Date of Patent: May 26, 2015

(54) POWER INVERTER INCLUDING A POWER SEMICONDUCTOR MODULE

(75) Inventors: Akira Ishii, Maebashi (JP); Keisuke Fukumasu, Fujisawa (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 152 days.

(21) Appl. No.: 13/992,074

(22) PCT Filed: Dec. 22, 2011

(86) PCT No.: PCT/JP2011/079882
§ 371 (c)(1),
(2), (4) Date: Jun. 6, 2013

(87) PCT Pub. No.: WO2012/090877
PCT Pub. Date: Jul. 5, 2012

(65) Prior Publication Data
US 2013/0265808 A1    Oct. 10, 2013

(30) Foreign Application Priority Data

Dec. 27, 2010   (JP) .................................. 2010-289948

(51) Int. Cl.
*H02M 1/00*      (2006.01)
*H05K 7/20*      (2006.01)
(Continued)

(52) U.S. Cl.
CPC ................ *H02M 1/12* (2013.01); *H02M 7/003* (2013.01)

(58) Field of Classification Search
USPC ............... 363/16, 37, 55, 71, 95, 97–98, 120, 363/131–132, 141, 144–147; 361/677, 361/679.46, 689, 703, 767, 775, 831
See application file for complete search history.

(56) References Cited

U.S. PATENT DOCUMENTS

| | | | |
|---|---|---|---|
| 7,187,568 B2 * | 3/2007 | Radosevich et al. | 363/144 |
| 7,561,448 B2 * | 7/2009 | Katayama et al. | 363/40 |

(Continued)

FOREIGN PATENT DOCUMENTS

| | | |
|---|---|---|
| JP | 2009-219270 A | 9/2009 |
| JP | 2010-110066 A | 5/2010 |
| JP | 2010-182898 A | 8/2010 |

OTHER PUBLICATIONS

International Search Report dated Feb. 14, 2012 with English translation (Two (2) pages).

*Primary Examiner* — Timothy J Dole
*Assistant Examiner* — Yusef Ahmed
(74) *Attorney, Agent, or Firm* — Crowell & Moring LLP

(57) ABSTRACT

A power inverter includes a power semiconductor module that includes a power semiconductor device, a control circuit board that outputs a control signal used for controlling the power semiconductor device, a driver circuit board that outputs a driving signal used for driving the power semiconductor device, a conductive metal base plate arranged in a space between the driver circuit board and the control circuit board in which a fine and long opening portion is formed, wiring that connects the driver circuit board and the control circuit board through the opening portion and delivers the control signal to the driver circuit board, and an AC busbar that is arranged on a side opposite to the metal base plate through the driver circuit board and delivers an AC current output from the power semiconductor module to a drive motor. At least a portion of the AC busbar that faces the opening portion extends in a direction directly running in a longitudinal direction of the fine and long opening portion.

8 Claims, 34 Drawing Sheets

(51) Int. Cl.
*H02M 1/12* (2006.01)
*H02M 7/00* (2006.01)

(56) References Cited

U.S. PATENT DOCUMENTS

| | | | |
|---|---|---|---|
| 7,710,721 B2* | 5/2010 | Matsuo et al. | 361/699 |
| 7,957,169 B2* | 6/2011 | Nakajima et al. | 363/141 |
| 7,978,471 B2* | 7/2011 | Tokuyama et al. | 361/699 |
| 8,159,849 B2* | 4/2012 | Nakajima et al. | 363/131 |
| 8,422,235 B2* | 4/2013 | Azuma et al. | 361/736 |
| 8,462,531 B2* | 6/2013 | Nishikimi et al. | 363/144 |
| 8,587,977 B2* | 11/2013 | Nishikimi et al. | 363/141 |
| 8,699,254 B2* | 4/2014 | Nishikimi et al. | 363/141 |
| 8,902,623 B2* | 12/2014 | Nishikimi et al. | 363/144 |
| 2002/0118560 A1* | 8/2002 | Ahmed et al. | 363/144 |
| 2005/0270745 A1* | 12/2005 | Chen et al. | 361/707 |
| 2006/0092611 A1* | 5/2006 | Beihoff et al. | 361/698 |
| 2007/0002594 A1* | 1/2007 | Otsuka et al. | 363/37 |
| 2007/0109715 A1* | 5/2007 | Azuma et al. | 361/299.3 |
| 2007/0165376 A1* | 7/2007 | Bones et al. | 361/688 |
| 2007/0246635 A1* | 10/2007 | Nakajima et al. | 248/637 |
| 2007/0246636 A1* | 10/2007 | Katayama et al. | 248/637 |
| 2008/0130223 A1* | 6/2008 | Nakamura et al. | 361/689 |
| 2009/0040724 A1* | 2/2009 | Nishikimi et al. | 361/699 |
| 2009/0231811 A1* | 9/2009 | Tokuyama et al. | 361/699 |
| 2010/0025126 A1* | 2/2010 | Nakatsu et al. | 180/65.1 |
| 2010/0097765 A1* | 4/2010 | Suzuki et al. | 361/699 |
| 2010/0188813 A1* | 7/2010 | Nakatsu et al. | 361/689 |
| 2010/0327654 A1* | 12/2010 | Azuma et al. | 307/9.1 |
| 2011/0249421 A1* | 10/2011 | Matsuo et al. | 361/821 |
| 2012/0039039 A1* | 2/2012 | Nishikimi et al. | 361/689 |
| 2012/0170217 A1* | 7/2012 | Nishikimi et al. | 361/689 |
| 2013/0021749 A1* | 1/2013 | Nakajima | 361/689 |
| 2013/0094269 A1* | 4/2013 | Maeda et al. | 363/141 |
| 2013/0265808 A1* | 10/2013 | Ishii et al. | 363/97 |
| 2013/0278194 A1* | 10/2013 | Numakura | 318/400.27 |
| 2013/0279114 A1* | 10/2013 | Nishikimi et al. | 361/699 |
| 2013/0294040 A1* | 11/2013 | Fukumasu et al. | 361/752 |
| 2014/0016387 A1* | 1/2014 | Nishikimi et al. | 363/132 |
| 2014/0126154 A1* | 5/2014 | Higuchi et al. | 361/714 |

* cited by examiner

POWER INVERTER INCLUDING A POWER SEMICONDUCTOR MODULE

TECHNICAL FIELD

The present invention relates to a power inverter that is used for converting DC power to AC power or AC power to DC power.

BACKGROUND ART

Generally, a power inverter includes a smoothing capacitor module that receives DC power from a DC power source, an inverter circuit that receives DC power from the capacitor module and generates AC power, and a control circuit that is used for controlling the inverter circuit. The AC power, for example, is supplied to an electrical motor, and the motor generates rotating torque in accordance with the supplied AC power. Generally, the electrical motor has a function of a generator, and, when mechanical energy is supplied to the electrical motor from the outside, the electrical motor generates AC power based on the supplied mechanical energy.

In many cases, the above-described power inverter has a function for converting AC power into DC power, and the AC power generated by the electrical motor is converted into DC power. The conversion from DC power to AC power or the conversion from AC power to DC power is controlled by the control device. For example, when the motor is a synchronous electrical motor, by controlling the phase of a rotating magnetic field generated by a stator with respect to a magnetic pole position of a rotor of the synchronous electrical motor, the control relating to the power conversion can be performed.

An example of the power inverter is disclosed in PTL 1. The power inverter, for example, is built in a vehicle, receives DC power from a secondary battery built in the vehicle and generates AC power to be supplied to an electrical motor generating rotating torque for driving.

CITATION LIST

Patent Literature

PTL 1: JP 2009-219270 A

SUMMARY OF INVENTION

Technical Problem

From a viewpoint of an environmental measure or the like, the importance of power inverters converting DC power into AC power for driving electrical motors increases more and more. When AC power of a high level for generating rotating torque used for driving is generated, an inverter circuit used for generating the AC power is a significant noise source. It is desirable that the deterioration of controllability due to the noise source or the influence of the noise source on vehicle auxiliary components such as a radio be reduced as much as possible.

Solution to Problem

According to a first aspect of the present invention, a power inverter includes: a power module that includes a power semiconductor device inverting a DC current into an AC current; a control circuit board that outputs a control signal used for controlling the power semiconductor device; a driver circuit board that outputs a driving signal used for driving the power semiconductor device based on the control signal; a conductive base plate arranged in a space between the driver circuit board and the control circuit board in which a fine and long wiring opening portion is formed; a control wiring that connects the driver circuit board and the control circuit board through the wiring opening portion and delivers the control signal to the driver circuit board; and an AC busbar that is arranged on a side opposite to the base plate through the driver circuit board and delivers the AC current output from the power module to a drive motor, in which at least a portion of the AC busbar that faces the wiring opening portion extends in a direction perpendicular to a longitudinal direction of the fine and long wiring opening portion.

According to a second aspect of the present invention, in the power inverter according to the first aspect, it is preferable that the AC busbar be configured by a U-phase AC busbar, a V-phase AC busbar, and a W-phase AC busbar used for allowing a three phase current to flow, and the U-phase AC busbar, the V-phase AC busbar, and the W-phase AC busbar be formed such that at least portions facing the wiring opening portion are parallel to each other.

According to a third aspect of the present invention, in the power inverter according to the second aspect, a sensor unit, which includes a magnetic core through which the AC busbar passes and a detection device detecting a magnetic flux density of the magnetic core, include current sensors disposed for the U-phase, V-phase, and W-phase AC busbars, and the current sensors are disposed at positions facing the wiring opening portion.

According to a fourth aspect of the present invention, the power inverter according to any one of the first to third aspects further includes: a conductive casing of a bottomed cylinder shape that has a casing opening portion closed by one face of the base plate and forms a housing space in which the driver circuit board is arranged; and a conductive cover body that is fixed to the other face of the base plate and forms a housing space in which the control circuit board is arranged between the base plate and the cover body. It is preferable that the base plate be fixed to the casing such that the one face is brought into contact with a circumferential edge of the casing opening portion.

According to a fifth aspect of the present invention, the power inverter according to the fourth aspect further includes an external connector that includes a lead wiring used for being connected to the control circuit board. It is preferable that the external connector be arranged such that the lead wiring is connected to the control circuit board through a space between the control circuit board and the base plate.

According to a sixth aspect of the present invention, in the power inverter according to the fifth aspect, it is preferable that the wiring opening portion be arranged at a position facing one edge of the control circuit board, and the external connector be disposed on an edge located on a side opposite to the one edge of the control circuit board.

According to a seventh aspect of the present invention, in the power inverter according to the fifth or sixth aspect, it is preferable that a wall portion surrounding a periphery of the control circuit board be integrally formed on the base plate, and a housing space in which the control circuit board is arranged be formed by fixing the cover body to an upper end of the wall portion.

According to an eighth aspect of the present invention, in the power inverter according to the seventh aspect, it is preferable that a notch portion to which the external connector is fitted be formed on the wall portion.

According to a ninth aspect of the present invention, the power inverter according to the first aspect further includes: an external connector that is electrically connected to the control circuit board; an AC terminal to which the AC busbar is connected; and a DC terminal that is used for supplying the DC current to the power module. It is preferable that the DC terminal and the AC terminal be arranged on a side face of one side of the casing, and the external connector be arranged on a side face located on a side opposite to the side face of the casing.

According to a tenth aspect of the present invention, the power inverter according to the ninth aspect further includes a DC busbar that is connected to the DC terminal inside the casing. It is preferable that an extending direction of the DC busbar extending from the DC terminal be parallel to an extending direction of the AC busbar extending from the AC terminal.

According to an eleventh aspect of the present invention, the power inverter according to the fourth aspect further includes a DC busbar that supplies the DC current to the power module. It is preferable that the base plate that closes the casing opening portion include a first base plate area closing a part of the casing opening portion and a second base plate area closing the other part, the control circuit board be arranged so as to face a cover body-side face of the first base plate area, the driver circuit board is arranged so as to face a casing-side face of the first base plate area, and the DC busbar be arranged so as to face a casing-side face of the second base plate area.

Advantageous Effects of Invention

According to the present invention, the noise immunity of a power inverter can be improved.

DESCRIPTION OF EMBODIMENTS

Figure 1:
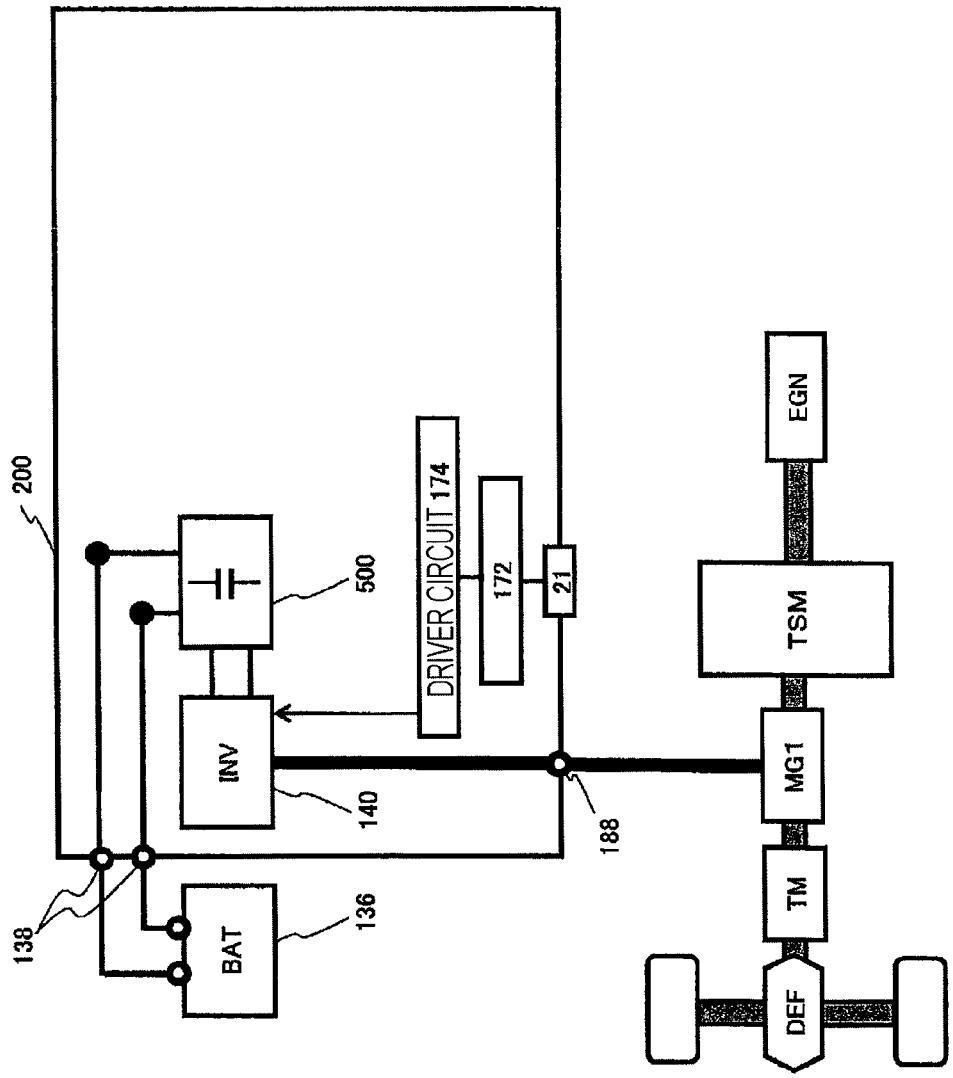
FIG. 1 is a system diagram that illustrates the system of a hybrid electric vehicle.

A power inverter according to an embodiment of the present invention and a system using this device, to be described as below, solve various problems that are desirable to be solved for productization. As one of the various problems solved by the embodiment, there is a problem relating to improvement of vibration resistance described in "Technical Problem" described above, and, not only the effect of the improvement of vibration resistance described in the above-described "Advantageous Effects of Invention" but also various problems other than the problems and the advantageous effects described above are solved, whereby various advantageous effects can be achieved. In addition, as a configuration that achieves an object of the improvement of the vibration resistance described in the above-described "Technical Problem" and the effect of the improvement of the vibration resistance described in the above-described "Advantageous Effects of Invention", not only a configuration described in the above-described "Solution to Problem" but also another configuration can solve the above-described problems, whereby the above-described advantageous effects can be acquired.

In other words, relating to the object and the advantageous effects of the improvement of vibration resistance, by employing a configuration other than the above-described configuration, the object and the advantageous effects relating to the improvement of the vibration resistance are largely achieved, and, more specifically, according to a different viewpoint, the object is achieved, and the advantageous effects are acquired. Hereinafter, several representative configurations thereof will be listed. In addition, the others will be described in description of the embodiments.

The power inverter includes a casing that houses a power semiconductor module inverting a DC current into an AC current, and a connector in which a DC-side connector and an AC-side connector are mechanically combined is fixed to the casing. A positive-side DC terminal and a negative-side DC terminal are arranged to be aligned along one side of one side face of the casing in the widthwise direction, and a U phase-side terminal, a V phase-side terminal, and a W phase-side terminal are arranged so as to be aligned along one side of one side face of the casing in the longitudinal direction. By employing such a configuration, the bias of the insertion stress of the connector is suppressed, whereby vibration resistance of the positive-side DC terminal, the negative-side DC terminal, and the AC terminal can be improved.

Configuration 2 that is another configuration for further achieving the desired object of the improvement of vibration resistance will be described next. Configuration 2 includes a support member that supports an AC terminal and a casing that forms an opening portion, and the casing further includes a wall protruding toward the outer side of the casing from the edge of the opening portion. In addition, a support member closes the first opening portion from the inner wall side of the casing, and an AC wiring connected to the electrical motor side passes through a space surrounded by the wall and is connected to the AC terminal supported by the support member. By employing such a configuration, the support member is brought into contact with the casing to a degree for closing the opening portion of the casing, and the AC wiring is supported by the wall protruding from the casing, whereby the resonance frequency of the AC terminal and the AC wiring can be configured to be higher than the frequency of vibration transferred from an engine or the like.

Configuration 3 for achieving an object of miniaturization will be described next. Configuration 3 includes: a capacitor circuit unit that smoothes a DC current; a cooling block that forms a flow path through which cooling coolant flows; a power semiconductor module that is supplied with a DC current output from the capacitor circuit unit and supplies a three phase current to an electrical motor; a casing that houses the capacitor circuit unit, the cooling block, and the power semiconductor module; and an electrical circuit device that is electrically connected to the capacitor circuit unit and the DC terminal in series or in parallel. The cooling block forms a first flow path and a second flow path, and the first and second flow paths are arranged to be parallel to each other with the capacitor circuit unit interposed therebetween. The power semiconductor module is configured to include a first power semiconductor module that outputs a first-phase AC current, a second power semiconductor module that outputs a second-phase AC current, and a third power semiconductor module that outputs a third-phase AC current. The first and second power semiconductor modules are fixed to be aligned in the first flow path along the flow direction of the cooling coolant flowing through the first flow path, the third power semiconductor module is fixed to the second flow path so as to face the first power semiconductor module through the capacitor circuit unit, and the electrical circuit device is arranged at a position facing the second power semiconductor module through the capacitor circuit unit. By employing such a configuration, even when two power semiconductor modules disposed for each phase are arranged on one side face of the capacitor circuit unit, and one power semiconductor module is arranged on the other side face, the power semiconductor modules and the capacitor circuit unit are orderly configured, and the cooling capability of the coolant follow path can be sufficiently drawn.

Hereinafter, an embodiment according to the present invention will be described with reference to the drawings. FIG. 1 is a diagram that illustrates a control block of a hybrid electric vehicle (hereinafter, referred to as an "HEV"). An engine EGN and a motor generator MG1 generate torque for driving a vehicle. In addition, the motor generator MG1 not only generates rotating torque but has a function for converting mechanical energy that is applied to the motor generator MG1 from the outside into electric power.

The motor generator MG1, for example, is a synchronous machine or an induction machine, and, as described above, may be operated as an electrical motor or a power generator in accordance with an operating method. In a case where the motor generator MG1 is mounted in a vehicle, the motor generator has preferably a small size and a high output, and a synchronous electrical motor of a permanent magnet type using a magnet such as a neodymium is appropriate as the motor generator. In addition, the synchronous electrical motor has heat generation of the rotor lower than that of an induction electrical motor and is superior for a vehicle from that viewpoint as well.

The output torque of the output side of the engine EGN is transferred to the motor generator MG1 through a power transfer TSM. The rotating torque transferred from the power transfer TSM or the rotating torque generated by the motor generator MG1 is transferred to wheels through a transmission TM and a differential gear DEF. Meanwhile, at the time of operating of regenerative braking, the rotating torque is transferred to the motor generator MG1 from the wheels, and AC power is generated based on the supplied rotating torque. The generated AC power is converted into DC power by a power inverter 200, as will be described later, and charges a high-voltage battery 136, and the charged electric power is used as driving energy again.

Next, the power inverter 200 will be described. An inverter circuit 140 is electrically connected to a battery 136 through a DC connector 138, and the battery 136 and the inverter circuit 140 perform power transmission/reception therebetween. In a case where the motor generator MG1 is operated as an electrical motor, the inverter circuit 140 generates AC power based on DC power supplied from the battery 136 through a DC connector 138 and supplies the generated AC power to the motor generator MG1 through an AC connector 188. A configuration formed by the motor generator MG and the inverter circuit 140 operates as a motor generator unit.

In this embodiment, by operating the motor generator unit as an electrical motor unit using electric power of the battery 136, the vehicle can be driven only using the power of the motor generator MG1. In addition, in this embodiment, by operating the motor generator unit as a power generation unit using the power of the engine EGN or the power transferred from the wheels so as to generate power, the battery 136 can be charged.

In addition, the power inverter 200 includes a capacitor module 500 used for smoothing DC power supplied to the inverter circuit 140.

The power inverter 200 includes a connector 21 for communication that is used for receiving an instruction from a control device of an upper level or transmitting data representing a state to the control device of the upper level. The power inverter 200 calculates the control amount of the motor generator MG1 using the control circuit 172 based on an instruction input from the connector 21, further calculates whether to operate as an electrical motor or a generator, generates a control pulse based on a result of the calculation, and supplies the control pulse to a driver circuit 174. The driver circuit 174 generates a control pulse used for controlling the inverter circuit 140 based on the supplied control pulse.

Next, the configuration of an electrical circuit of the inverter circuit 140 will be described with reference to FIG. 2. Hereinafter, an insulated gate bipolar transistor is used as a semiconductor device and will be abbreviated as an IGBT. A series circuit 150 of upper and lower arms is configured by an IGBT 328 and a diode 156 that operate as an upper arm and an IGBT 330 and a diode 166 that operate as a lower arm. The inverter circuit 140 includes the series circuits 150 in correspondence with three phases of an U phase, a V phase, and a W phase of AC power to be output.

In this embodiment, these three phases correspond to winding wires of three phases of armature windings of the motor generator MG1. The series circuit 150 of the upper and lower arms of each one of the three phases outputs an AC current from a neutral point 169 that is a middle point portion of the series circuit. This neutral point 169 is connected to AC busbars 802 and 804, to be described below, that are AC power lines to the motor generator MG1 through the AC terminals 159 and 188.

A collector 153 of the IGBT 328 of the upper arm is electrically connected to a positive-side capacitor terminal 506 of the capacitor module 500 through a positive terminal 157. In addition, an emitter of the IGBT 330 of the lower arm is electrically connected to a negative-side capacitor terminal 504 of the capacitor module 500 through a negative terminal 158.

As described above, the control circuit 172 receives a control instruction from the control device of the upper level through the connector 21, generates control pulses that are control signals used for controlling the IGBT 328 and the IGBT 330 configuring the upper arm or the lower arm of the series circuit 150 of each phase configuring the inverter circuit 140 based on this control instruction, and supplies the generated control pulses to the driver circuit 174.

The driver circuit 174 supplies drive pulses used for controlling the IGBT 328 and the IGBT 330 configuring the upper arm or the lower arm of the series circuit 150 of each phase to the IGBT 328 and the IGBT 330 of each phase based on the control pulses. The IGBT 328 and the IGBT 330 perform a conduction or cut-off operation based on the drive pulses supplied from the driver circuit 174 and converts DC power supplied from the battery 136 into three phase current. The converted power is supplied to the motor generator MG1.

The IGBT 328 includes collector 153, the emitter 155 used for a signal, and a gate 154. In addition, the IGBT 330 includes the collector 163, the emitter 165 used for a signal, and a gate 164. The diode 156 is electrically connected between the collector 153 and the emitter 155. In addition, the diode 166 is electrically connected between the collector 163 and the emitter 165.

As a switching power semiconductor device, a metal oxide semiconductor field effect transistor (hereinafter, abbreviated as an MOSFET) may be used, and, in such a case, the diodes 156 and 166 are unnecessary. As the switching power semiconductor device, the IGBT is appropriate in a case where a DC voltage is relatively high, and the MOSFET is appropriate in a case where a DC voltage is relatively low.

The capacitor module 500 includes a positive-side capacitor terminal 506, a negative-side capacitor terminal 504, a positive-side power source terminal 509, and a negative-side power source terminal 508. High-voltage DC power supplied from the battery 136 is supplied to the positive-side power source terminal 509 and the negative-side power source terminal 508 through the DC connector 138 and is supplied from the positive-side capacitor terminal 506 and the negative-side capacitor terminal 504 of the capacitor module 500 to the inverter circuit 140.

Meanwhile the DC power converted from the AC power by the inverter circuit 140 is supplied from the positive-side capacitor terminal 506 and the negative-side capacitor terminal 504 to the capacitor module 500, is supplied from the positive-side power source terminal 509 and the negative-side power source terminal 508 to the battery 136 through the DC connector 138, and is accumulated in the battery 136.

The control circuit 172 includes a microcomputer (hereinafter, referred to as a "microcomputer") used for performing a calculation process of switching timings of the IGBT 328 and the IGBT 330. As input information input to the microcomputer, there are a target torque value required for the motor generator MG1, a current value supplied from the series circuit 150 to the motor generator MG1, and a magnetic pole position of the rotor of the motor generator MG1.

The target torque value is based on an instruction signal output from the control device of the higher level that is not illustrated in the figure. The current value is detected based on a detection signal detected by the current sensor 180. The magnetic pole position is detected based on a detection signal output from a rotational magnetic pole sensor (not illustrated in the figure) such as a resolver disposed in the motor generator MG1. In this embodiment, while a case has been described in which the current sensor 180 detects a three phase current value, a current corresponding to 2 phases may be detected, and the three phase current may be acquired through a calculation.

The microcomputer disposed inside the control circuit 172 calculates current instruction values of the d axis and the q axis of the motor generator MG1 based on the target torque value, calculates voltage instruction values of the d axis and the q axis based on the calculated current instruction values of the d axis and the q axis and difference values from the detected current values of the d axis and the q axis, and converts the calculated voltage instruction values of the d axis and the q axis into voltage instruction values of the U phase, the V phase, and the W phase based on the detected magnetic pole position. Then, the microcomputer generates a pulse-shaped modulated wave based on a comparison between a fundamental wave (sinusoidal wave) and a carrier wave (triangular wave) that are based on the voltage instruction values of the U phase, the V phase, and the W phase, and outputs the generated modulated wave to the driver circuit 174 as a PWM (pulse width modulation) signal.

Ina case where the lower arm is driven, the driver circuit 174 outputs a drive signal acquired by amplifying the PWM signal to the gate of the IGBT 330 of the corresponding lower arm. On the other hand, in a case where the upper arm is driven, the driver circuit 174 shifts the level of the reference electric potential of the PWM signal to the level of the reference electric potential of the upper arm, then amplifies the PWM signal, and outputs a resultant signal to the gate of the IGBT 328 of the corresponding upper arm as a drive signal.

In addition, the microcomputer disposed inside the control circuit 172 performs detection of an abnormality (an overcurrent, an overvoltage, an excess temperature or the like), thereby protecting the series circuit 150. Accordingly, sensing information is input to the control circuit 172. For example, from emitters 155 and 165 of each arm that are used for signals, information of currents flowing through the emitters of the IGBT 328 and the IGBT 330 is input to a corresponding driving unit (IC). From this, each driving unit (IC) detects an overcurrent and protects the IGBT 328 and the IGBT 330 corresponding thereto from the overcurrent by stopping the switching operations of the IGBT 328 and the IGBT 330 corresponding thereto in a case where an overcurrent is detected.

From a temperature sensor (not illustrated) disposed in the series circuit 150, the information of the temperature of the series circuit 150 is input to the microcomputer. In addition, the information of the DC positive-side voltage of the series circuit 150 is input to the microcomputer. The microcomputer performs excess temperature detection and overvoltage detection based on such information and stops the switching operations of all the IGBTs 328 and 330 in a case where an excess temperature or an overvoltage is detected.

Figure 3:
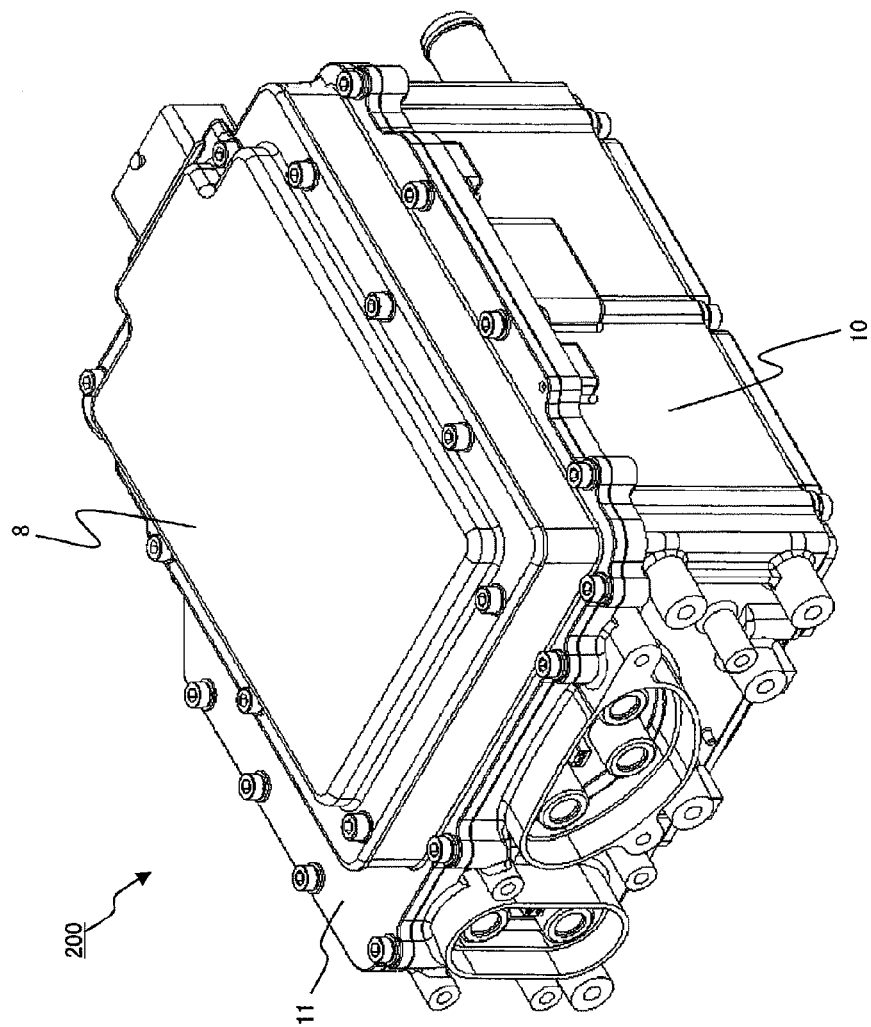
FIG. 3 is a perspective view that illustrates the outer appearance of a power inverter 200.
Figure 4:
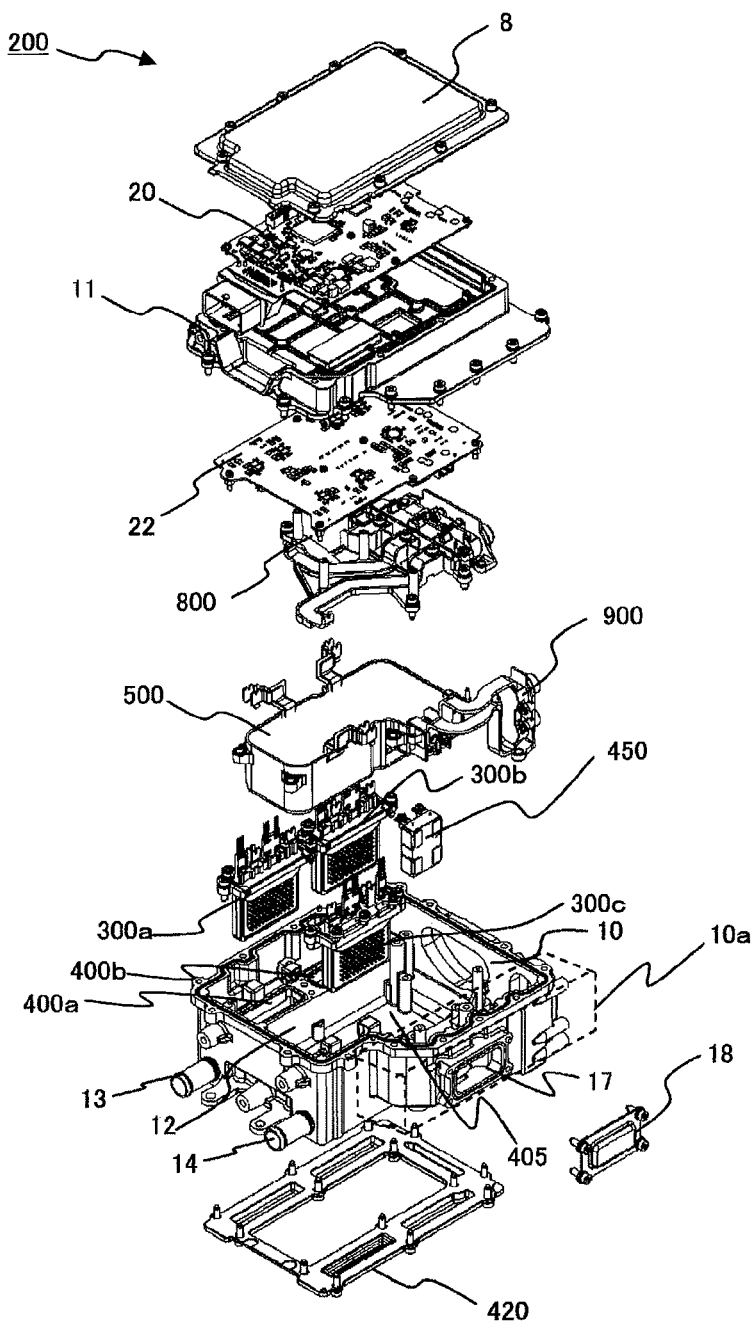
FIG. 4 is an exploded perspective view of the power inverter 200.

FIG. 3 is a perspective view that illustrates the outer appearance of the power inverter 200. FIG. 4 is a diagram that illustrates the internal configuration of a casing 10 of the power inverter 200 and is an exploded perspective view of the power inverter 200. The power inverter 200 includes the power semiconductor modules 300a to 300c, the casing 10 in which the capacitor module 500 is housed, a busbar assembly 800 arranged on the upper side of the capacitor module 500, a driver circuit board 22 arranged on the upper side of the busbar assembly 800, a metal base plate 11 fixed to the upper side of the casing 10, a control circuit board 20 housed in the metal base plate 11, and a cover 8 fixed to an upper portion of the metal base plate 11.

A cooling block 12 used for allowing a cooling medium to flow is formed in the casing 10, and a lower cover 420 closing the opening arranged on the lower side of the cooling block 12 is attached to the lower face of the casing 10. As above, the cooling block 12 is arranged at the bottom of the power inverter 200, and next, the operations of fixing necessary components such as the capacitor module 500, the busbar assembly 800, and a board can be sequentially performed from the top, whereby the productivity and the reliability are improved.

Figure 5:
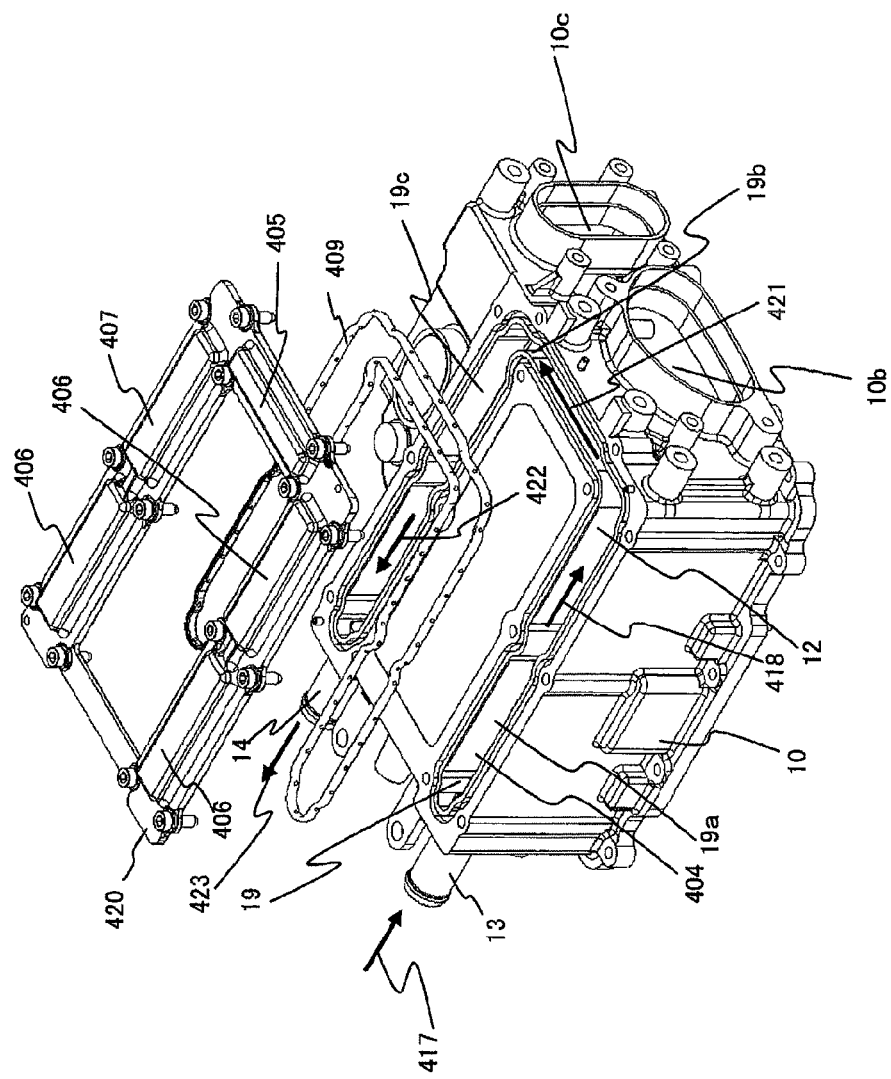
FIG. 5 is a diagram that illustrates a casing 10 and a cooling block 12.

FIG. 5 is a diagram that illustrates the casing 10 and the cooling block 12 and is a diagram of the casing 10 illustrated in FIG. 4 seen from the bottom. The cooling block 12 forms a "U"-shaped coolant path 19 along the inner periphery faces of the casing 10 that are arranged on three sides. The coolant path 19 is formed by a first flow path portion 19a that is formed along a side of the casing 10 in the longitudinal direction, a second flow path portion 19b that is formed along a side of the casing 10 in the widthwise direction, and a third flow path portion 19c that is formed along a side of the cooling block 12 in the longitudinal direction. The second flow path portion 19b forms an instant flow path of the U-shaped coolant path 19 forming the U shape.

On the side face of the casing 10, which is a side face located on a side opposite to a side on which the second flow path portion 19b is formed, an inlet pipe 13 used for introducing coolant and an outlet pipe 14 used for allowing the coolant to flow out are disposed. The coolant passes the inlet pipe 13 in a flowing direction 417 indicated by an arrow and flows inside the first flow path portion 19a in a flowing direction 418. Then, after flowing through the second flow path portion 19b in a flowing direction 421, the coolant flows through the third flow path portion 19c in a flowing direction 422, passes the output pipe 14 in a flowing direction 423, and flows out. All the first, second, and third flow path portions 19a, 19b, and 19c are formed such that a length in the depth direction is longer than a length in the width direction.

A lower face-side opening 404 of the cooling block 12 is closed by a lower cover 420 attached to the lower face of the casing 10. Between the lower cover 420 and the casing 10, a sealing member 409 is disposed so as to maintain airtightness. In the lower cover 420, a convex portion 406 protruding to a side opposite to the side on which the coolant path 19 is arranged is formed. The convex portion 406 is disposed to be in correspondence with the power semiconductor modules 300a to 300c arranged inside the coolant path 19 to be described below. In addition, a convex portion 407 is not in correspondence with the power semiconductor module but is disposed so as to adjust the cross-sectional area of the coolant path 19.

As will be described below, also on the casing inner periphery side of the cooling block 12, opening portions 400a to 400c are formed (see FIG. 12 to be described below). Since the opening portion 404 formed on the casing rear face side and the opening portions 400a to 400c of the casing inner periphery side are formed so as to face each other, a configuration that can be easily manufactured by aluminum casting is formed. By forming the main structure of the coolant path 19 to be integrated with the cooling block 12 using a casting made of aluminum, the coolant path 19 has an effect of improving the mechanical strength in addition to the cooling effect. In addition, by forming the coolant path 19 through aluminum casting, the cooling block 12 and the coolant path 19 have an integrated structure, and accordingly the heat conduction is improved, whereby the cooling efficiency is improved. Furthermore, by integrally forming the cooling block 12 and the casing 10 using a casting made of aluminum, the coolant path 19 has an effect of further improving the mechanical strength in addition to the cooling effect. In addition, by integrally forming the cooling block 12 and the casing 10 through casting, the heat conduction of the whole power inverter 200 is improved, whereby the cooling efficiency is improved.

Referring back to FIG. 4, in an upper face of one side (a side on which the coolant path 19a illustrated in FIG. 5 is formed) of the cooling block 12 in the longitudinal direction of the casing 10, the opening portions 400a and 400b are formed along the side face of the casing 10, and, although not illustrated in the figure, in the upper face of the other side (a side on which the coolant path 19b illustrated in FIG. 5 is formed), the opening portion 400c is formed. The opening portions 400a to 400c are closed by the inserted power semiconductor modules 300a to 300c. Between both sides of the cooling block 12, a housing space 405 in which the capacitor module 500 is housed is formed. By housing the capacitor module 500 in the housing space 405, the capacitor module 500 is cooled by the coolant flowing inside the coolant path 19. Since the capacitor module 500 is arranged so as to be surrounded by the coolant paths 19a to 19c illustrated in FIG. 5, the capacitor module 500 is cooled with high efficiency.

As above, since the coolant path 19 is formed along the outer face of the capacitor module 500, the coolant path 19, the capacitor module 500, and the power semiconductor module 300 are orderly arranged, thereby decreasing in size as a whole. In addition, since the coolant paths 19a and 19c are arranged along the longer side of the capacitor module 500, distances between the power semiconductor modules 300 that are inserted to be fixed to the coolant path 19 and the capacitor module 500 are approximately constant. Accordingly, the circuit constant of the smoothing capacitor and the power semiconductor module circuit can be easily balanced for each layer of three phases, and a circuit configuration that can easily decrease a spike voltage is formed. In this embodiment, water is the most appropriate as the cooling medium. However, a cooling medium other than water can be used and, hereinafter, will be referred to as a coolant.

On the upper side of the capacitor module 500, the busbar assembly 800 to be described below is arranged. The busbar assembly 800 includes an AC busbar and a holder and holds the current sensor 180. The busbar assembly 800 will be described in detail below. The driver circuit board 22 is arranged on the upper side of the busbar assembly 800. In addition, between the driver circuit board 22 and the control circuit board 20, the metal base plate 11 is arranged.

The metal base plate 11 is fixed to the casing 10. The metal base plate 11 has a function for electronically shielding a circuit group mounted on the driver circuit board 22 and the control circuit board 20 and an action of cooling by getting rid of the heat generated by the driver circuit board 22 and the control circuit board 20. The metal base plate 11 has a high noise suppressing function, which will be described below.

In addition, the metal base plate 11 has an action of increasing the mechanical resonance frequency of the control circuit board 20. In other words, screw fixing portions used for fixing the control circuit board 20 to the metal base plate 11 can be arranged at a short interval, and a distance between support points in a case where a mechanical vibration occurs can be shortened, whereby the resonance frequency can be increased. Since the resonance frequency of the control circuit board 20 can be high with respect to the vibration frequency transferred from the engine or the like, the influence of the vibration is not easily received, and the reliability is improved.

In addition, a cover 18 fixed to the casing 10 is a member for closing an operating window 17 used for connecting a terminal prolonged from a DCDC inverter. The cover 8 fixed to the metal base plate 11 has a function for protecting the control circuit board 20 from an electromagnetic noise transmitted from the outside.

In the casing 10 according to this embodiment, a portion in which the cooling block 12 is housed has the shape of an approximate rectangular parallelepiped, and a protruded housing portion 10a is formed from one side face side of the casing 10. In the protruded housing portion 10a, a terminal prolonged from the DCDC inverter and DC busbars 902a and 902b and a resistor 450 to be described below are housed. Here, the resistor 450 is a resistor that is used for discharging electric charge accumulated in the capacitor element of the capacitor module 500. As above, since electric circuit components between the battery 136 and the capacitor module 500 are integrated in the protruded housing portion 10a, the complication of wiring can be suppressed, whereby the size of the whole device can be decreased.

The detailed configuration of the power semiconductor modules 300a to 300c used in the inverter circuit 140 will be described with reference to FIGS. 6 to 14. All the structures of the power semiconductor modules 300a to 300c have the same structure, and the structure of the power semiconductor module 300a will be representatively described. In FIGS. 6 to 14, a signal terminal 325U corresponds to the gate 154 and the emitter 155 for a signal illustrated in FIG. 2, and a signal terminal 325L corresponds to the gate 164 and the emitter 165 illustrated in FIG. 2. A DC positive terminal 315B is the same as the positive terminal 157 illustrated in FIG. 2, and a DC negative terminal 319B is the same as the negative terminal 158 illustrated in FIG. 2. In addition, an AC terminal 320B is the same as the AC terminal 159 illustrated in FIG. 2.

Figure 6:
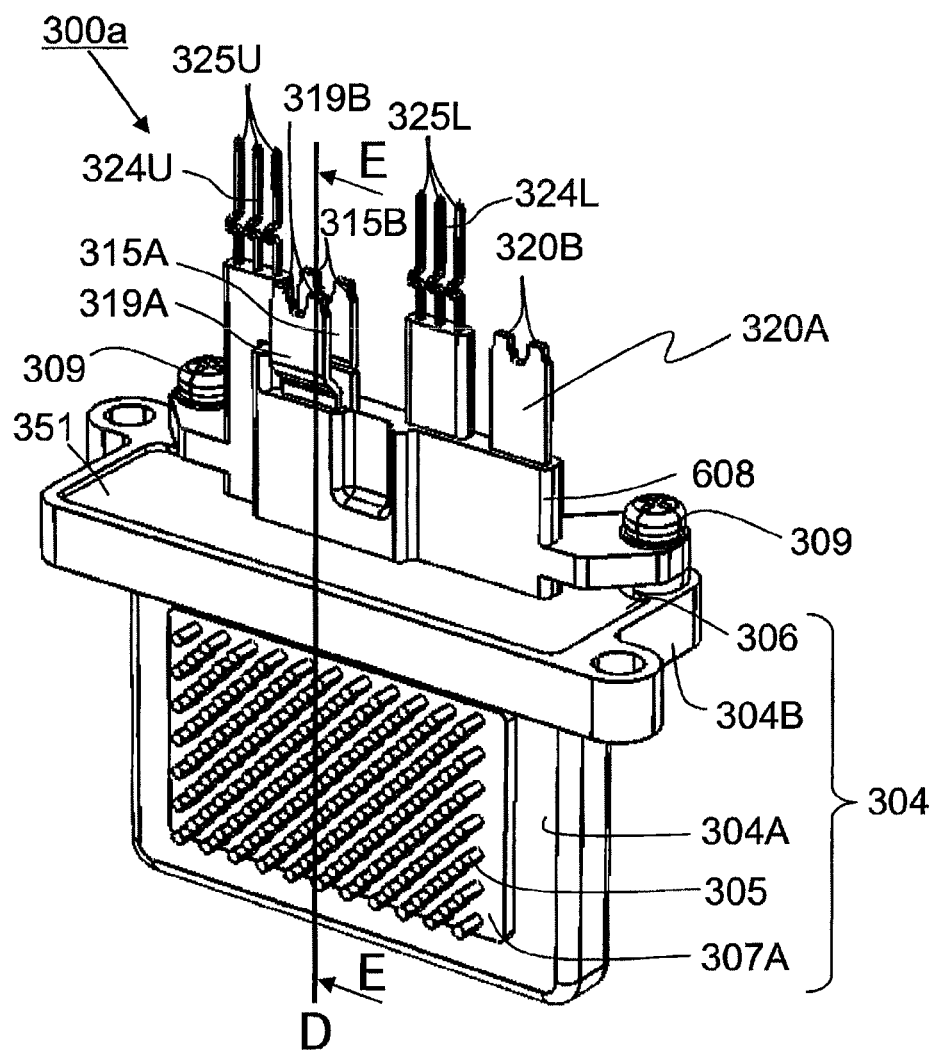
FIG. 6 is a perspective view of a power semiconductor module 300a according to this embodiment.
Figure 7:
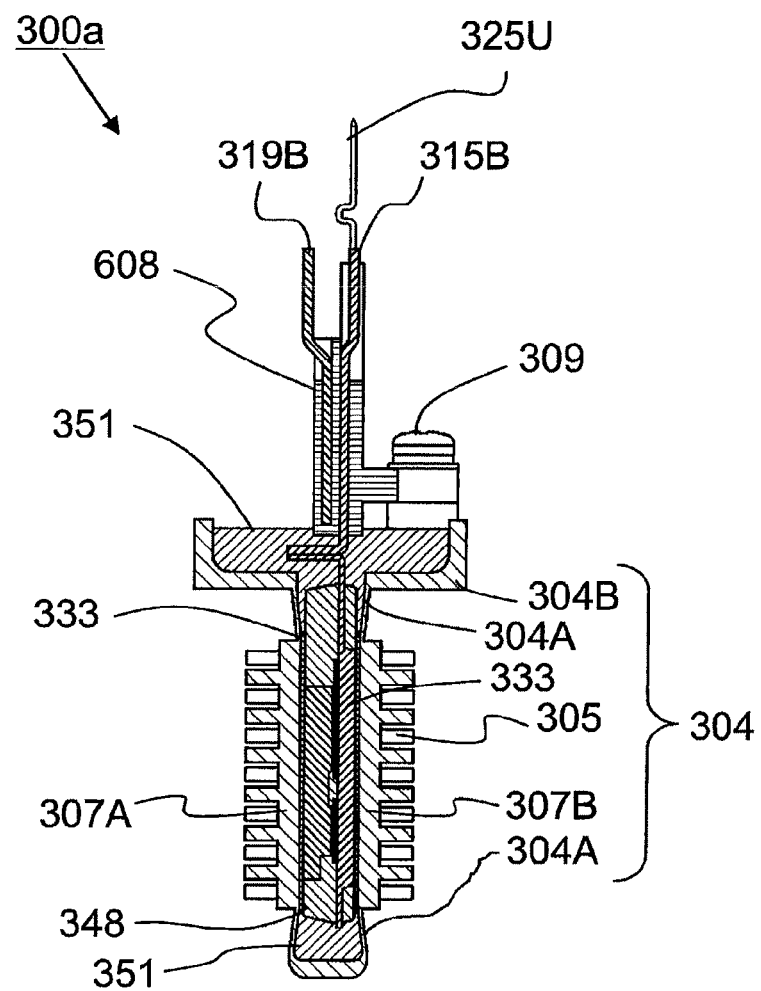
FIG. 7 is a cross-sectional view of the power semiconductor module 300a taken along the line E-E.
Figure 8:
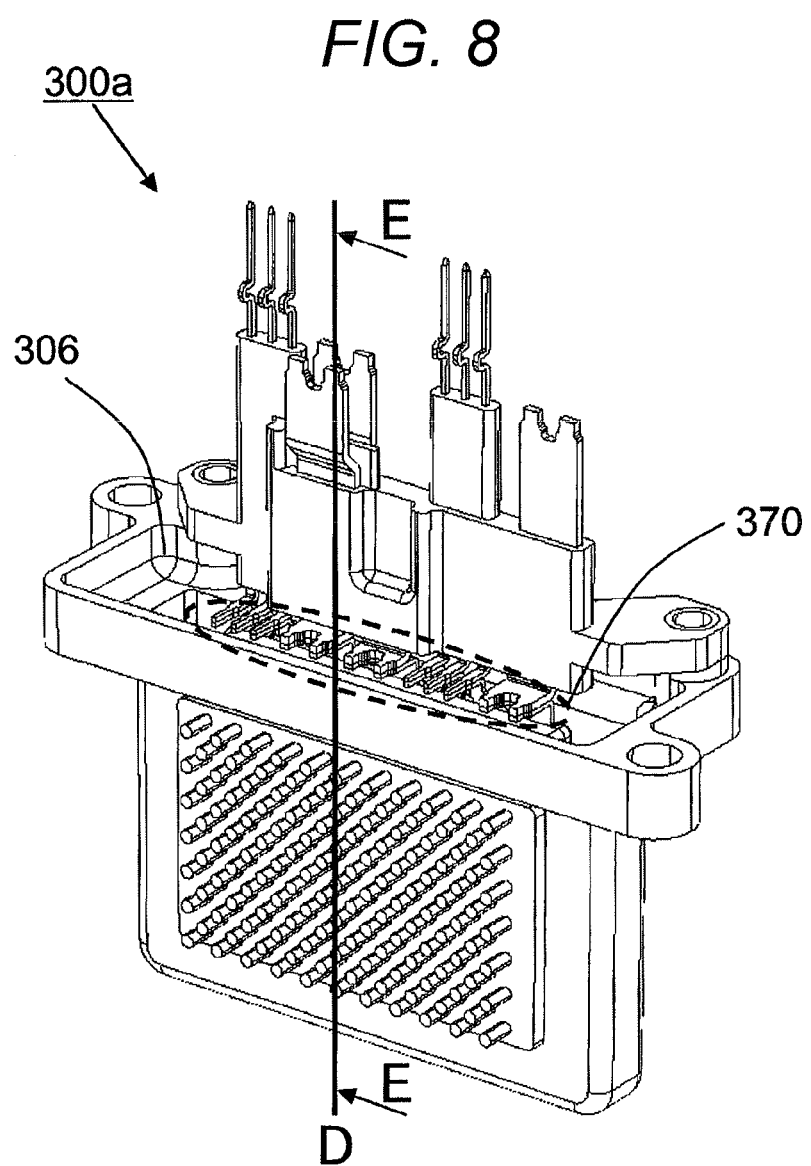
FIG. 8 is a perspective view that illustrates the power semiconductor module 300a acquired by eliminating screws 309 and a second potting resin 351 from the state illustrated in FIG. 6.
Figure 9:
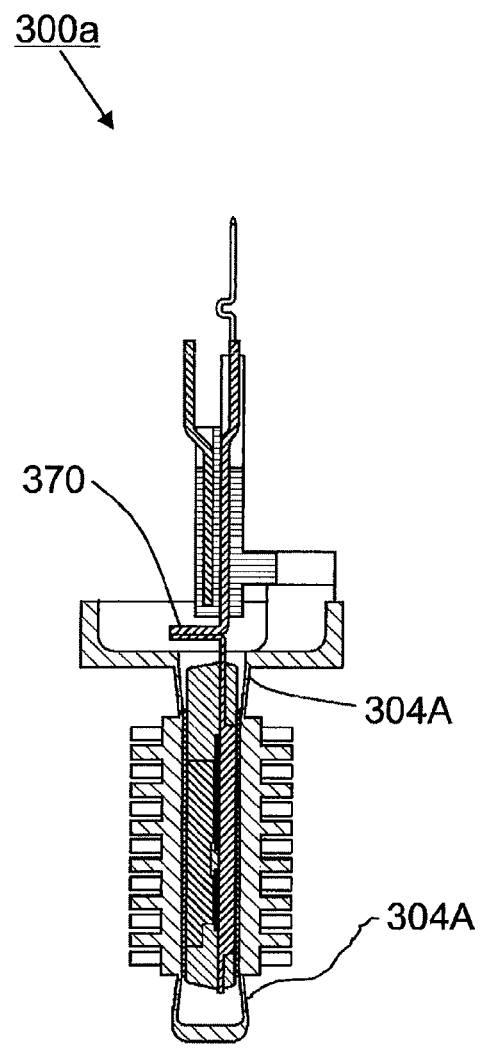
FIG. 9 is a cross-sectional view of the power semiconductor module 300a illustrated in FIG. 8 taken along the line E-E.
Figure 10:
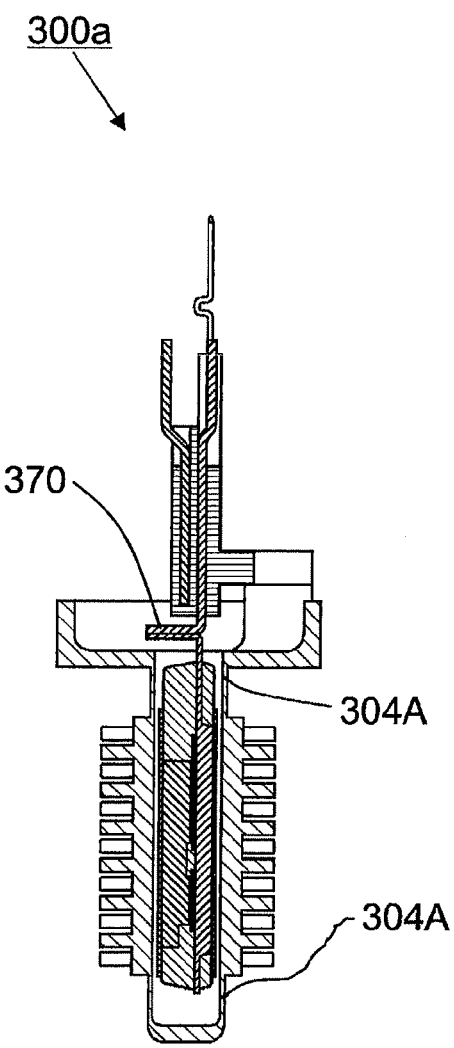
FIG. 10 is a cross-sectional view taken along the line E-E before the deformation of a bending portion 304A.

FIG. 6 is a perspective view of the power semiconductor module 300a according to this embodiment. FIG. 7 is a cross-sectional view of the power semiconductor module 300a of this embodiment taken along the line E-E, which is acquired by cutting at a portion D illustrated in FIG. 6 and being seen in direction E. FIG. 8 is a perspective view that illustrates the power semiconductor module 300a acquired by eliminating screws 309 and a second potting resin 351 (see FIG. 7) from the state illustrated in FIG. 6. FIG. 9 is a cross-sectional view of FIG. 8 taken along the line E-E. FIG. 10 is a cross-sectional view similar to FIG. 9 and is a cross-sectional view before a pin 305 is pressed, and a bending portion 304A is deformed.

Figure 11:
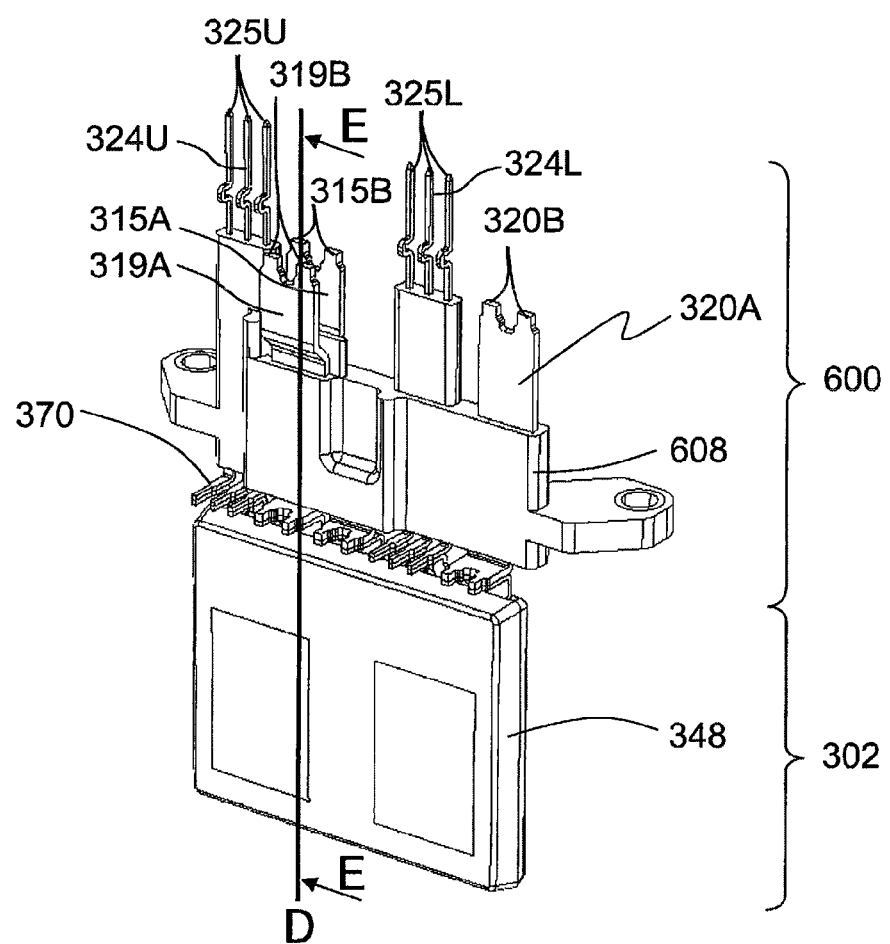
FIG. 11 is a perspective view that illustrates the power semiconductor module 300a acquired by further eliminating a module casing 304 from the state illustrated in FIG. 8.

FIG. 11 is a perspective view that illustrates the power semiconductor module 300a acquired by further eliminating a module casing 304 from the state illustrated in FIG. 8. FIG. 12 is a cross-sectional view taken along the line E-E illustrated in FIG. 11. FIG. 13 is a perspective view of the power semiconductor module 300a acquired by further eliminating a first potting resin 348 and a wiring insulating portion 608 from the state illustrated in FIG. 11. FIG. 14 is a diagram that illustrates an assembly process of a module primary potting body 302.

Figure 12:
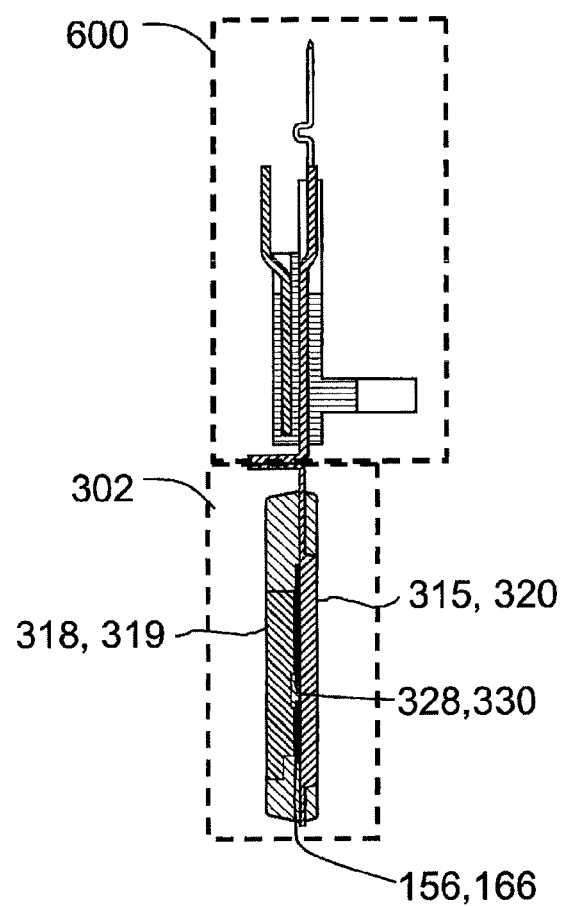
FIG. 12 is a cross-sectional view taken along the line E-E illustrated in FIG. 11.
Figure 13:
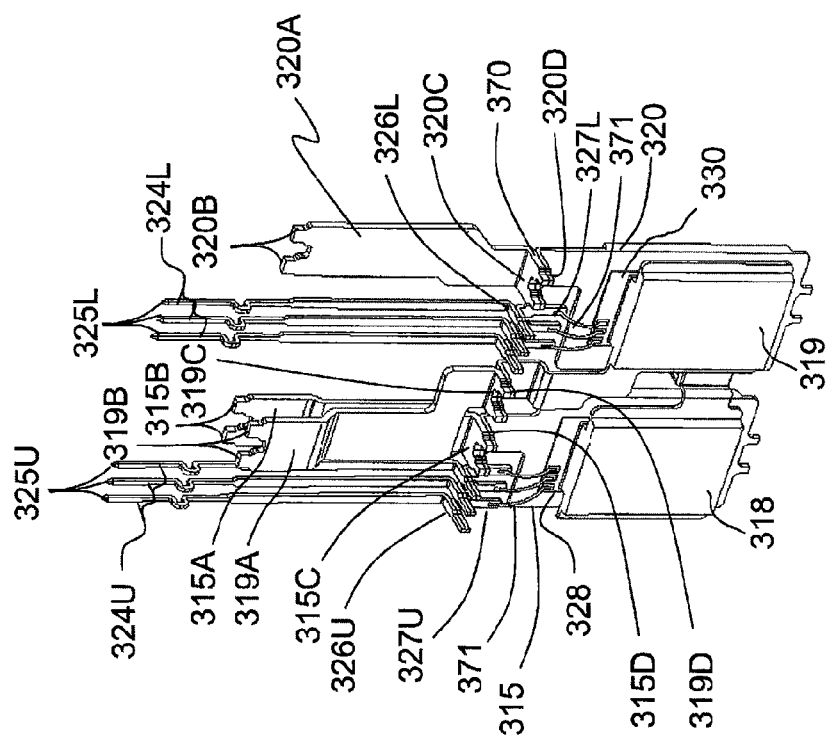
FIG. 13 is a perspective view of the power semiconductor module 300a acquired by further eliminating a first potting resin 348 and a wiring insulating portion 608 from the state illustrated in FIG. 11.
Figure 14:
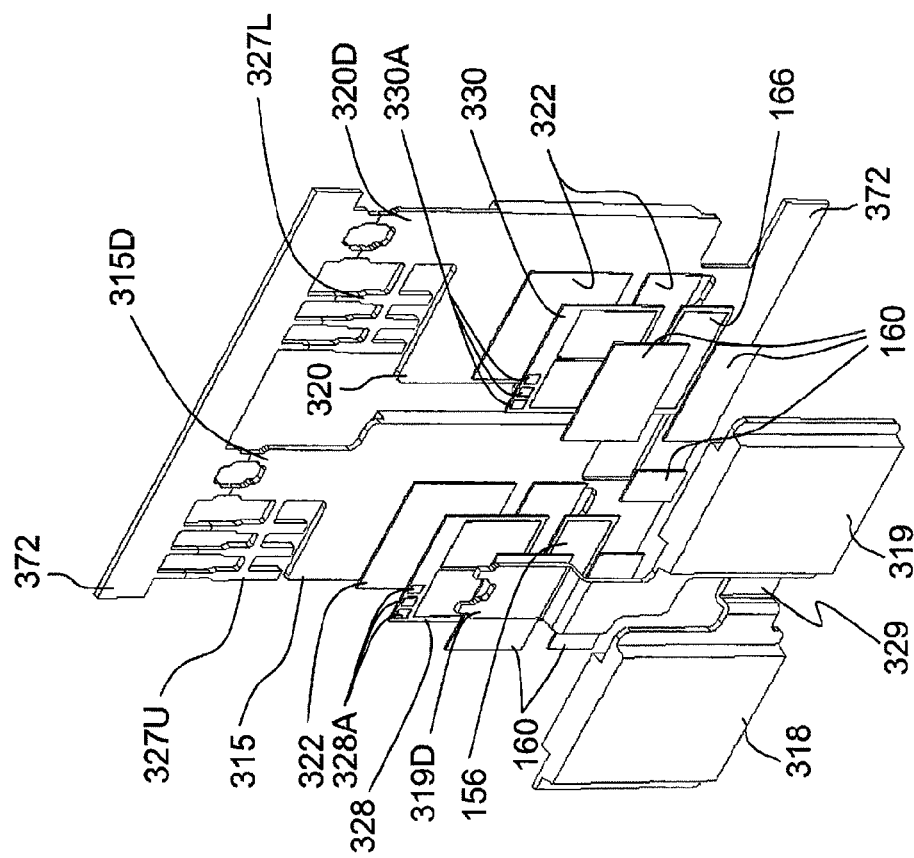
FIG. 14 is a diagram that illustrates an assembly process of a module primary potting body 302.

The power semiconductor devices (the IGBT 328, the IGBT 330 and the diodes 156 and 166) configuring the series circuit 150 of the upper and lower arms, as illustrated in FIGS. 11 to 13, are sandwiched by conductive plates 315 and 318 and conductive plates 320 and 319 from both sides and are fixed thereto. The conductive plate 315 and the like are sealed by the first potting resin 348 in a state in which a heat dissipating face thereof is exposed, and an insulation sheet 333 is thermally compressed and bonded to the heat dissipating face. The first potting resin 348, as illustrated in FIG. 11, has a polyhedron shape (here, an approximate rectangular parallelepiped shape).

The module primary potting body 302 sealed by the first potting resin 348 is inserted into the inside of the module casing 304 so as to interpose the insulation sheet 333 between the inner face of the module casing 304, which is a can-type cooler, and the module primary potting body 302 and is thermally compressed and bonded to the inner face of the module casing 304. Here, the can-type cooler is a can-shaped cooler having an insertion opening 306 on one face and a bottom on the other face. In a space remaining inside the module casing 304, a second potting resin 351 is filled.

The module casing 304 is configured by a member having electrical conductivity, for example, an aluminum alloy material (Al, AlSi, AlSiC, Al—C, or the like) and is integrally molded in the state of having no joint. The module casing 304 has a structure having no opening other than the insertion opening 306. The outer circumference of the insertion opening 306 is surrounded by a flange 304B. In addition, as illustrated in FIG. 6, a first heat dissipating face 307A and a second heat dissipating face 307B having faces broader than those of the other faces are arranged in the state facing each other, and the power semiconductor devices (the IGBT 328, the IGBT 330, and the diodes 156 and 166) are arranged to face such heat dissipating faces. Three faces connected to the first and second heat dissipating faces 307A and 307B configure faces sealed in a width narrower than those of the first and second heat dissipating faces 307A and 307B, and the insertion opening 306 is formed in a face of the remaining one side. The shape of the module casing 304 does not need to be a precise rectangular parallelepiped, and the corners thereof may form curved faces as illustrated in FIG. 6.

By using the metal casing having such a shape, even in a case where the module casing 304 is inserted into the inside of the coolant path 19 in which a coolant such as water or oil flows, the sealing of the coolant can be secured by the flange 304B, and accordingly, the cooling medium can be prevented from penetrating into the inside of the module casing 304 by employing a simple configuration. In addition, in the first and second heat dissipating faces 307A and 307B facing each other, pins 305 are uniformly formed. Furthermore, on the outer periphery of the first and second heat dissipating faces 307A and 307B, a bending portion 304A of which the thickness is extremely thin is formed. Since the bending portion 304A is formed to be extremely thin to a degree for which the bending portion is simply deformed by pressing the pins 305, the productivity after the insertion of the module primary potting body 302 is improved.

As described above, by thermally compressing and bonding the conductive plate 315 and the like to the inner wall of the module casing 304 through the insulation sheet 333, a gap between the conductive plate 315 and the like and the inner wall of the module casing 304 can decrease, whereby the heat generated in the power semiconductor devices can be transferred to the pins 305 with high efficiency. In addition, by implementing the thickness and the flexibility to the degrees of those of the insulation sheet 333, the generated thermal stress can be absorbed by the insulation sheet 333, and accordingly, the semiconductor module can be used in a power inverter for a vehicle of which a temperature change is intense.

Outside the module casing 304, a DC positive wiring 315A and a DC negative wiring 319A, which are made from metal, used for being electrically connected to the capacitor module 500 are disposed, and, in the distal end portions thereof, a DC positive terminal 315B (157) and a DC negative terminal 319B (158) are formed. In addition, in the motor generator MG1, a metal AC wiring 320A used for supplying AC power to the motor generator MG1 is disposed, and, in the distal end, an AC terminal 320B (159) is formed. In this embodiment, as illustrated in FIG. 13, the DC positive wiring 315A is connected to the conductive plate 315, the DC negative wiring 319A is connected to the conductive plate 319, and the AC wiring 320A is connected to the conductive plate 320.

In addition, outside the module casing 304, signal wirings 324U and 324L, which are made from metal, used for being electrically connected to the driver circuit 174 are disposed, and, in the distal end portion thereof, signal terminals 325U (154, 155) and 325L (164 and 165) are formed. In this embodiment, as illustrated in FIG. 13, the signal wiring 324U is connected to the IGBT 328, and the signal wiring 324L is connected to the IGBT 328.

The DC positive wiring 315A, the DC negative wiring 319A, the AC wiring 320A, and the signal wirings 324U and 324L are integrally molded as a connecting part 600 (see FIG. 11) in the state of being insulated from each other by the wiring insulation portion 608 molded using a resin material. The wiring insulating portion 608 also acts as a support member used for supporting each wiring, and a resin material used therefor is preferably a thermosetting resin or a thermoplastic resin having an insulating property. From this, the insulating property between the DC positive wiring 315A, the DC negative wiring 319A, the AC wiring 320A, and the signal wirings 324U and 324L can be secured, whereby high-density wiring can be performed.

After being metallic bonded to the module primary potting body 302 at a connection portion 370, the connecting part 600 is fixed to the module casing 304 using a screw 309 passing through a screw hole arranged in the wiring insulating portion 608. For the metallic bonding between the module primary potting body 302 and the connecting part 600 at the connection portion 370, for example, TIG welding or the like can be used.

The DC positive wiring 315A and the DC negative wiring 319A are staked together in the state of facing each other with the wiring insulating portion 608 interposed therebetween and forms a shape extending in parallel with each other. By employing such an arrangement and the shape, current that instantly flows at the time of a switching operation of the power semiconductor devices face each other and flow in opposite directions. From this, magnetic fields generated by the currents act to be offset with each other, and implementation of low inductance can be performed based on this action. Here, the AC wiring 320A and the signal terminals 325U and 325L extends in the same direction as that of the DC positive wiring 315A and the DC negative wiring 319A.

The connection portion 370 in which the module primary potting body 302 and the connecting part 600 are connected through metallic bonding is sealed inside the module casing 304 by the second potting resin 351. From this, a necessary insulation distance between the connection portion 370 and the module casing 304 can be secured in a stable manner, and the size of the power semiconductor module 300a can be implemented to be smaller than that of a case where sealing is not performed.

As illustrated in FIG. 13, on the connecting part 600 side of the connection portion 370, a connecting part-side DC positive connection terminal 315C, a connecting part-side DC negative connection terminal 319C, a connecting part-side AC connection terminal 320C, a connecting part-side signal connection terminal 326U, and a connecting part-side signal connection terminal 326L are arranged so as to be aligned in one row. On the other hand, on the module primary potting body 302 side of the connection portion 370, along one face of the first potting resin 348 having a polyhedron shape, a device-side DC positive connection terminal 315D, a device-side DC negative connection terminal 319D, a device-side AC connection terminal 320D, a device-side signal connection terminal 327U, and a device-side signal connection terminal 327L are arranged so as to be aligned in one row. As above, by employing the configuration in which the terminals are aligned in one row in the connection portion 370, the module primary potting body 302 can be easily manufactured by transfer mold.

Here, the positional relations between the terminals when a portion extending from the first potting resin 348 of the module primary potting body 302 to the outer side is viewed as one terminal for each type will be described. In description presented below, a terminal that is configured by the DC positive wiring 315A (including the DC positive terminal 315B and the connecting part-side DC positive connection terminal 315C) and the device-side DC positive connection terminal 315D will be described as a positive-side terminal, a terminal that is configured by the DC negative wiring 319A (including the DC negative terminal 319B and the connecting part-side DC negative connection terminal 319C) and the device-side DC negative connection terminal 315D will be referred to as a negative-side terminal, a terminal that is configured by the AC wiring 320A (including the AC terminal 320B and the connecting part-side AC connection terminal 320C) and the device-side AC connection terminal 320D will be referred to as an output terminal, a terminal that is configured by the signal wiring 324U (including the signal terminal 325U and the connecting part-side signal connection terminal 326U) and the device-side signal connection terminal 327U will be referred to as an upper arm signal terminal, and a terminal that is configured by the signal wiring 324L (including the signal terminal 325L and the connecting part-side signal connection terminal 326L) and the device-side signal connection terminal 327L will be referred to as a lower arm signal terminal.

Each terminal described above protrudes from the first potting resin 348 and the second potting resin 351 through the connection portion 370, and the protruded portions (the device-side DC positive connection terminal 315D, the device-side DC negative connection terminal 319D, the device-side AC connection terminal 320D, the device-side signal connection terminal 327U, and the device-side signal connection terminal 327L) protruded from the first potting resin 348 are aligned in one row along one face of the first potting resin 348 having a polyhedron shape as described above. In addition, the positive-side terminal and the negative-side terminal protrude from the second potting resin 351 in a stacked state and extend to the outside of the module casing 304. By employing such a configuration, at the time of mold closing when the module primary potting body 302 is manufactured by sealing the first potting resin 348 and the power semiconductor device, excess stress applied to a connection portion between the power semiconductor device and the terminal and generation of a gap in the metal mold can be prevented. In addition, owing to the currents in opposite directions that flow through the positive-side terminal and the negative-side terminal that are stacked, magnetic fluxes are generated in directions for offsetting the magnetic fluxes with each other, and accordingly, implementation of low inductance can be achieved.

On the connecting part 600 side, the connecting part-side DC positive connection terminal 315C and the connecting part-side DC negative connection terminal 319C are formed in distal end portions of the DC positive wiring 315A and the DC negative wiring 319A on a side opposite to the DC positive terminal 315B and the DC negative terminal 319B. In addition, the connecting part-side AC connection terminal 320C is formed in a distal end portion of the AC wiring 320A that is located on a side opposite to the AC terminal 320B. The connecting part-side signal connection terminals 326U and 326L are formed in distal end portions of the signal wirings 324U and 324L located on a side opposite to the signal terminals 325U and 325L.

On the other hand, on the module primary potting body 302 side, the device-side DC positive connection terminal 315D, the device-side DC negative connection terminal 319D, and the device-side AC connection terminal 320D are formed on the conductive plates 315, 319, and 320, in addition, the device-side signal connection terminals 327U and 327L are connected to the IGBTs 328 and 330 by a bonding wire 371.

As illustrated in FIG. 14, the DC positive-side conductive plate 315, the AC output-side conductive plate 320, and the device-side signal connection terminals 327U and 327L are integrally processed so as to be arranged on an approximate same plane in the state of being connected to a common tie bar 372. The collector of the IGBT 328 on the upper arm side and the cathode of the diode 156 on the upper arm side are fixed to the conductive plate 315. The collector of the IGBT 330 on the lower arm side and the cathode of the diode 166 on the lower arm side are fixed to the conductive plate 320. On the IGBTs 328 and 330 and the diodes 155 and 166, the conductive plates 318 and 319 are arranged on an approximate same plane. The emitter of the IGBT 328 on the upper arm side and the anode of the diode 156 on the upper arm side are fixed to the conductive plate 318. The emitter of the IGBT 330 on the lower arm side and the anode of the diode 166 on the lower arm side are fixed to the conductive plate 319. Each power semiconductor device is fixed to a device fixation portion 322 disposed in each conductive plate through a metal bonded joint 160. The metal bonded joint 160 is, for example, a soldering member, a low-temperature sintering joint including a silver sheet and fine metal particles, or the like.

Each power semiconductor device has a plate-shaped flat structure, and the electrodes of the power semiconductor device are formed on the front and rear faces. As illustrated in FIG. 14, the electrodes of the power semiconductor devices are interposed by the conductive plates 315 and 318 or the conductive plates 320 and 319. In other words, the conductive plates 315 and 318 have a stacked arrangement facing each other through the IGBT 328 and the diode 156 so as to be approximately parallel to each other. Similarly, the conductive plates 320 and 319 have a stacked arrangement facing each other through the IGBT 330 and the diode 166 so as to be approximately parallel to each other. In addition, the conductive plates 320 and 318 are connected to each other through a neutral point 329. In accordance with this connection, the upper arm circuit and the lower arm circuit are electrically connected to each other, thereby forming a series circuit of the upper and lower arms. As described above, the IGBT 328 and the diode 156 are sandwiched between the conductive plates 315 and 318, the IGBT 330 and the diode 166 are sandwiched between the conductive plates 320 and 319, and the conductive plates 320 and 318 are connected together through the neutral point 329. Thereafter, a control electrode 328A of the IGBT 328 and a device-side signal connection terminal 327U are connected using the bonding wire 371, and a control electrode 330A of the IGBT 330 and a device-side signal connection terminal 327L are connected using the bonding wire 371.

Figure 15:
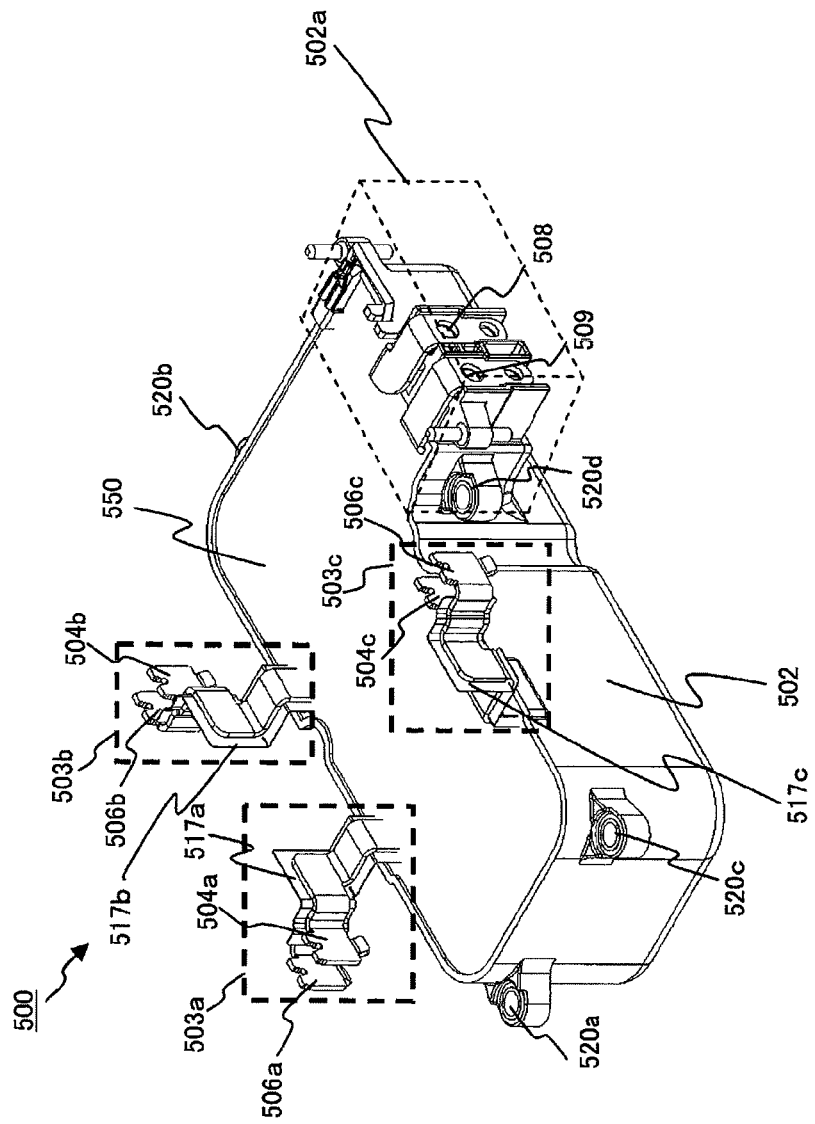
FIG. 15 is a perspective view of a capacitor module 500.

FIG. 15 is a perspective view of the capacitor module 500. Although not illustrated in FIG. 15, inside the capacitor casing 502, a plurality of film capacitors are disposed, and the film capacitors are electrically connected to the negative conductive plate and the positive conductive plate. Between the negative conductive plate and the positive conductive plate, a member having an insulation property is arranged so as to lower the inductance, and the negative conductive plate and the positive conductive plate are configured in a stacked state. In other words, the negative conductive plate and the positive conductive plate configure a stacked conductive plate.

A resin potting material 550 is filled in the capacitor casing 502 so as to fix the film capacitors and the stacked conductive plates to the capacitor casing 502. The negative-side power source terminal 508 and the positive-side power source terminal 509 are electrically connected to the staked conductive plates, protrude from an exposed face of the resin potting material 550, and are folded to the side face of the capacitor casing 502. DC power is supplied to the positive-side power source terminal 509 and the negative-side power source terminal 508 through the DC connector 138 as described with reference to FIG. 2.

The capacitor terminals 503a to 503c are electrically connected to the staked conductive plates and are disposed in correspondence with the positive terminal 157 (315B) and the negative terminal 158 (319B) of the power semiconductor module 300. The capacitor terminals 503a to 503c are connected to the power semiconductor modules 300a to 300c. Between the negative-side capacitor terminal 504a and the positive-side capacitor terminal 506a configuring the capacitor terminal 503a, an insulation sheet 517a is disposed, and the insulation property is secured. The other capacitor terminals 503b and 503c are similarly configured. In the capacitor casing 502, a fixation unit that is used for fixing the capacitor module 500 to the cooling block 12, for example, holes 520a to 520d used for passing screws are disposed.

In addition, on one side face, which is on the side of a longer side, of the capacitor casing 502, a protruded housing portion 502a is formed. Inside this protruded housing portion 502a, an electrical circuit device that is electrically connected to the film capacitors and the power source terminals 508 and 509 in parallel or in series is housed. In this embodiment, as the electrical circuit device, a noise elimination capacitor is housed, eliminates a noise transmitted from the battery 136, and is electrically connected to the ground.

Since this capacitor is smaller than the film capacitor, the protruded housing portion 502a is formed to have a height lower than that of the capacitor casing 502. In other words, a space is formed on the lower side of the protruded housing portion 502a. The cooling block 12 illustrated in FIG. 3 forms a part of the coolant path 19 in this space. From this, the noise elimination capacitor can be cooled, and a local increase in the cross-sectional area of the coolant path 19 is suppressed so as to prevent an increase in the pressure loss.

As illustrated in FIG. 3, the power semiconductor module 300c is fixed to the cooling block 12 so as to face the power semiconductor module 300a through the capacitor module 500, and the noise elimination capacitor is arranged at a position facing the power semiconductor module 300b through the capacitor module 500. From this, even in a case where an arrangement is employed in which two of the power semiconductor modules 300a to 300c disposed for each phase are arranged on one side face of the capacitor module 500, and one thereof is arranged on the other side face, the power semiconductor modules 300a to 300c and the capacitor modules 500 are orderly configured, and the cooling capacity of the coolant path 19 can be sufficiently drawn.

Furthermore, as described above, the power source terminals 508 and 509 protrude from the protruded housing portion 502a. Accordingly, the power source terminals 508 and 509 are arranged so as to be closer to the noise elimination capacitor than any one of the power semiconductor modules 300a to 300c, and the influence of the noise on the power semiconductor modules 300a to 300 is reduced.

Figure 16:
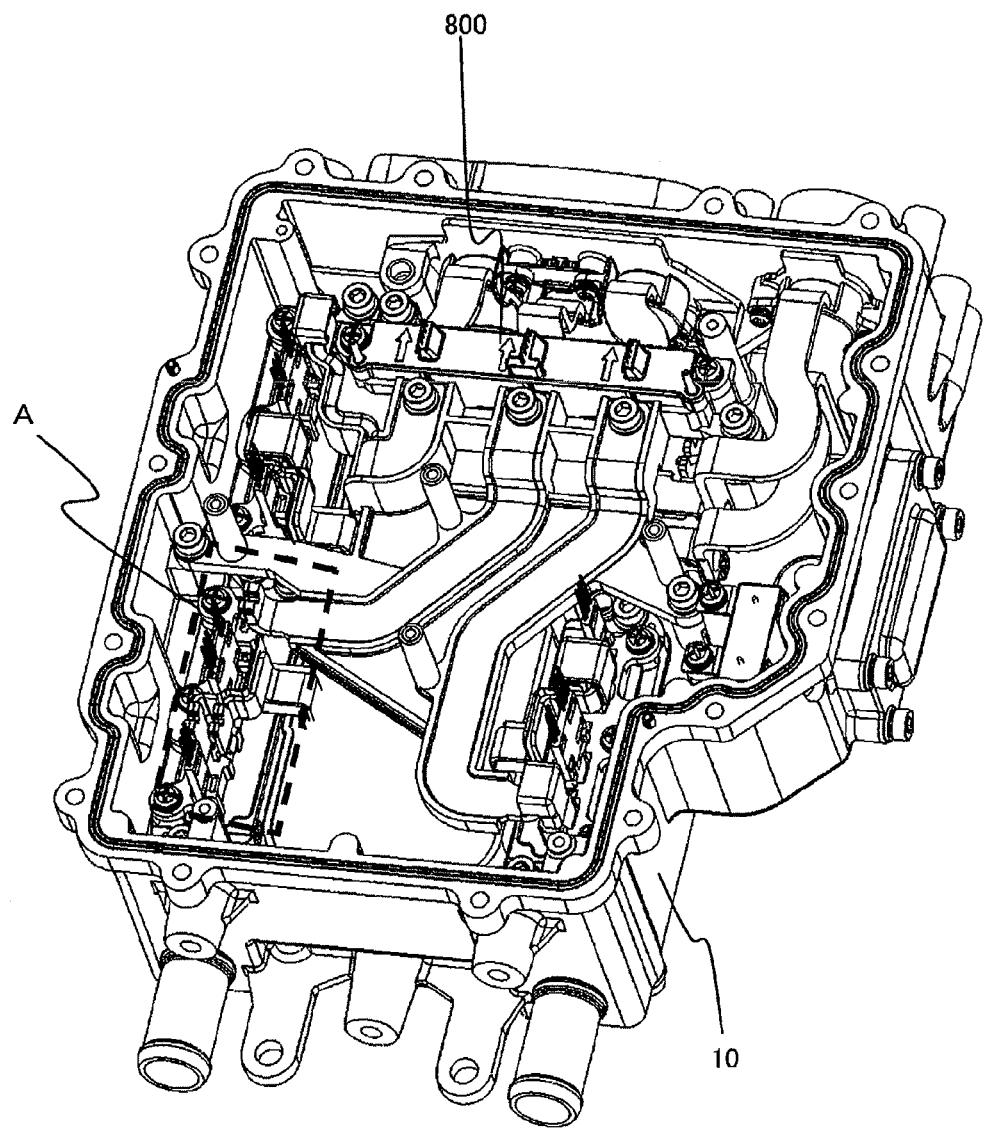
FIG. 16 is a perspective view that illustrates the outer appearance of power semiconductor modules 300a to 300c, the capacitor module 500, and a busbar assembly 800 imposed in the casing 10.
Figure 17:
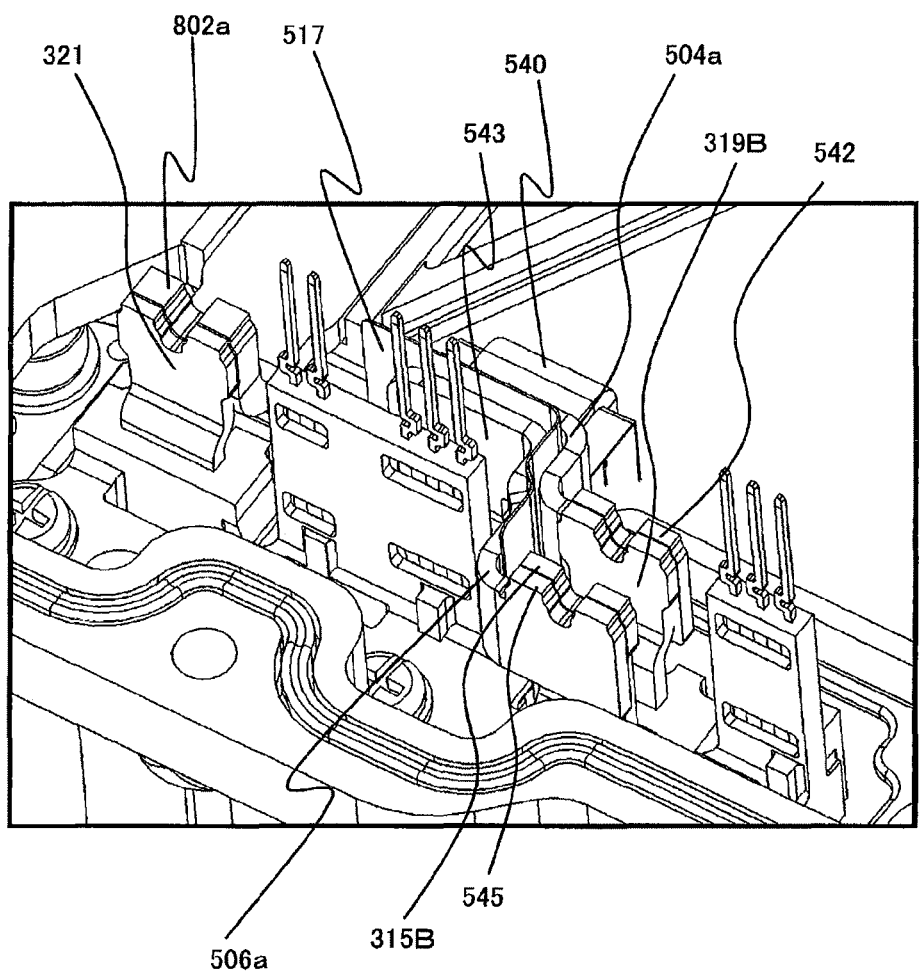
FIG. 17 is an enlarged diagram of a part that is represented by a reference sign A illustrated in FIG. 16.

FIG. 16 is a perspective view that illustrates the outer appearance of the power semiconductor modules 300a to 300c, the capacitor module 500, and the busbar assembly 800 imposed in the casing 10. FIG. 17 is an enlarged diagram of a part that is represented by a reference sign A illustrated in FIG. 16. The DC positive terminal 315B (157), the DC negative terminal 319B (158), the AC terminal 321 (159), and a second potting unit 601B extend toward the cover 8 side in the vertical direction of the casing 10. The area of the current path of the DC positive terminal 315B (157) and the DC negative terminal 319B (158) is much smaller than the area of the current path of the stacked conductive plates disposed inside the capacitor module 500. Accordingly, when currents flow from the stacked conductive plates to the DC positive terminal 315B (157) and the DC negative terminal 319B (158), the area of the current path markedly changes. In other words, the current is concentrated in the DC positive terminal 315B (157) and the DC negative terminal 319B (158).

Thus, in this embodiment, the negative-side capacitor terminal 504a includes a rise portion 540 that rises from the stacked conductive plates, and a connection portion 542 is included in the distal end portion thereof. In addition, the positive-side capacitor terminal 506a includes a rise portion 543 that rises from the stacked conductive plates, and a connection portion 545 is included in the distal end portion thereof. Between the connection portions 542 and 545, the DC negative terminal 319B (158) or the DC positive terminal 315B (157) of the power semiconductor module 300a are connected to be sandwiched.

From this, since a stacked structure is formed in which the negative-side capacitor terminal 504a and the positive-side capacitor terminal 506a are through the insulation sheet right before the connection portions 542 and 545, the inductance of a wiring portion of the capacitor terminal in which the current is concentrated can be reduced. In addition, the distal end of the DC negative terminal 319B (158) and the side face of the connection portion 542 are connected by welding, and, similarly, the distal end of the DC positive terminal 315B (157) and the side face of the connection portion 545 are connected by welding. Accordingly, in addition to the improvement of the characteristics through implementation of low inductance, the productivity can be improved.

The distal end of the AC terminal 321 (159) of the power semiconductor module 300a and the distal end of the AC bus bar 802a are connected by welding. In production facilities for welding, a case where a welding machine is configured to be operable for a plurality of directions with respect to a welding target leads to complication of the production facilities, which is not desirable from the viewpoint of the productivity and the cost. Thus, in this embodiment, a welding portion of the AC terminal 321 (159) and the welding portion of the DC negative terminal 319B (158) are arranged on one straight line along a side of the casing 10 in the longitudinal direction. Form this, a plurality of welding processes can be performed while the welding machine is operated in one direction, whereby the productivity is improved.

In addition, as illustrated in FIGS. 4, 16, and 17, a plurality of the power semiconductor modules 300a and 300b are arranged on one straight line along a side of the casing 10 in the longitudinal direction. Accordingly, when the plurality of the power semiconductor modules 300a to 300b are welded, the productivity can be further improved.

Figure 18:
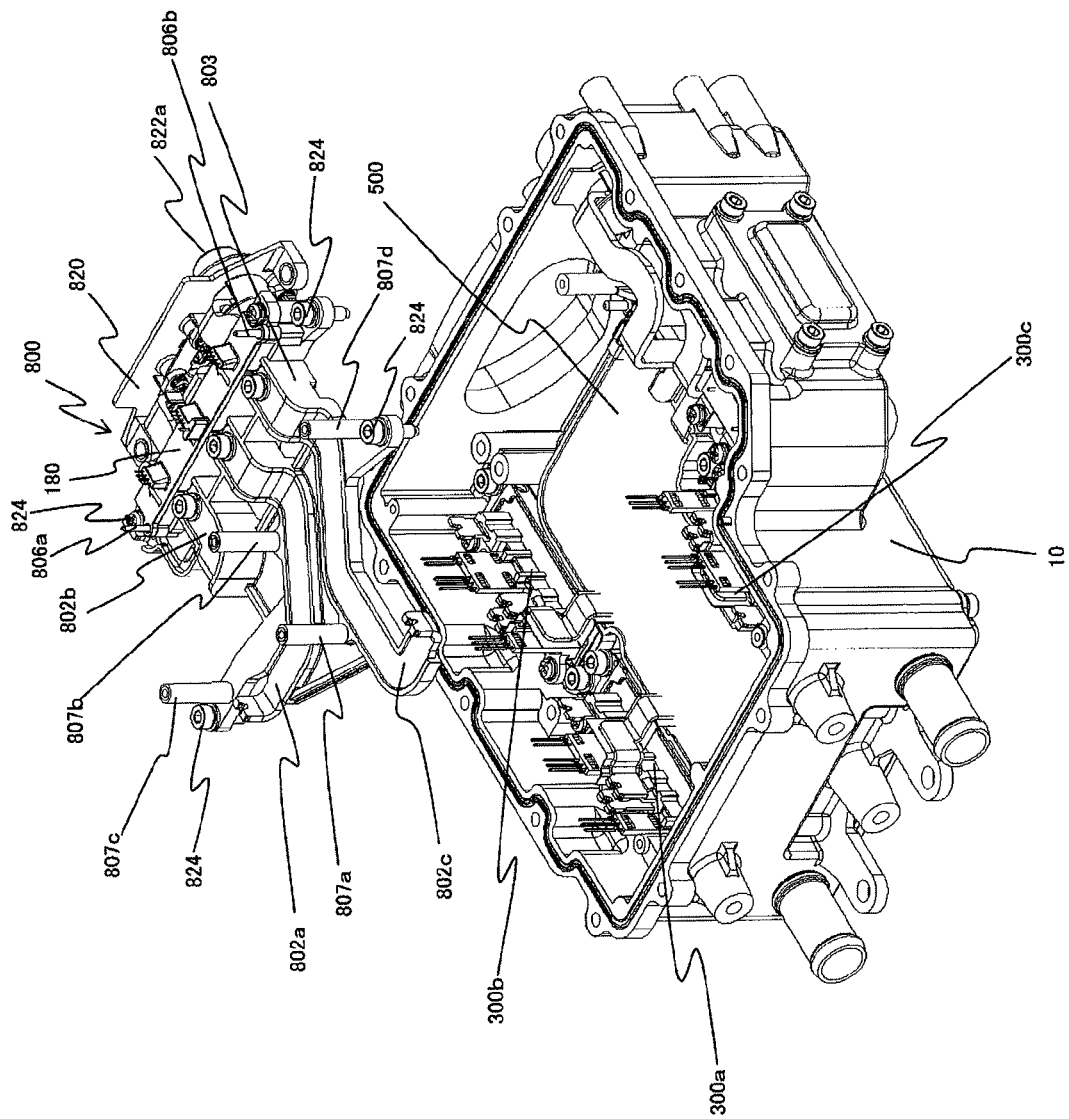
FIG. 18 is an exploded perspective view that illustrates the casing 10 in which the power semiconductor modules 300a to 300c and the capacitor module 500 are imposed and the busbar assembly 800.
Figure 19:
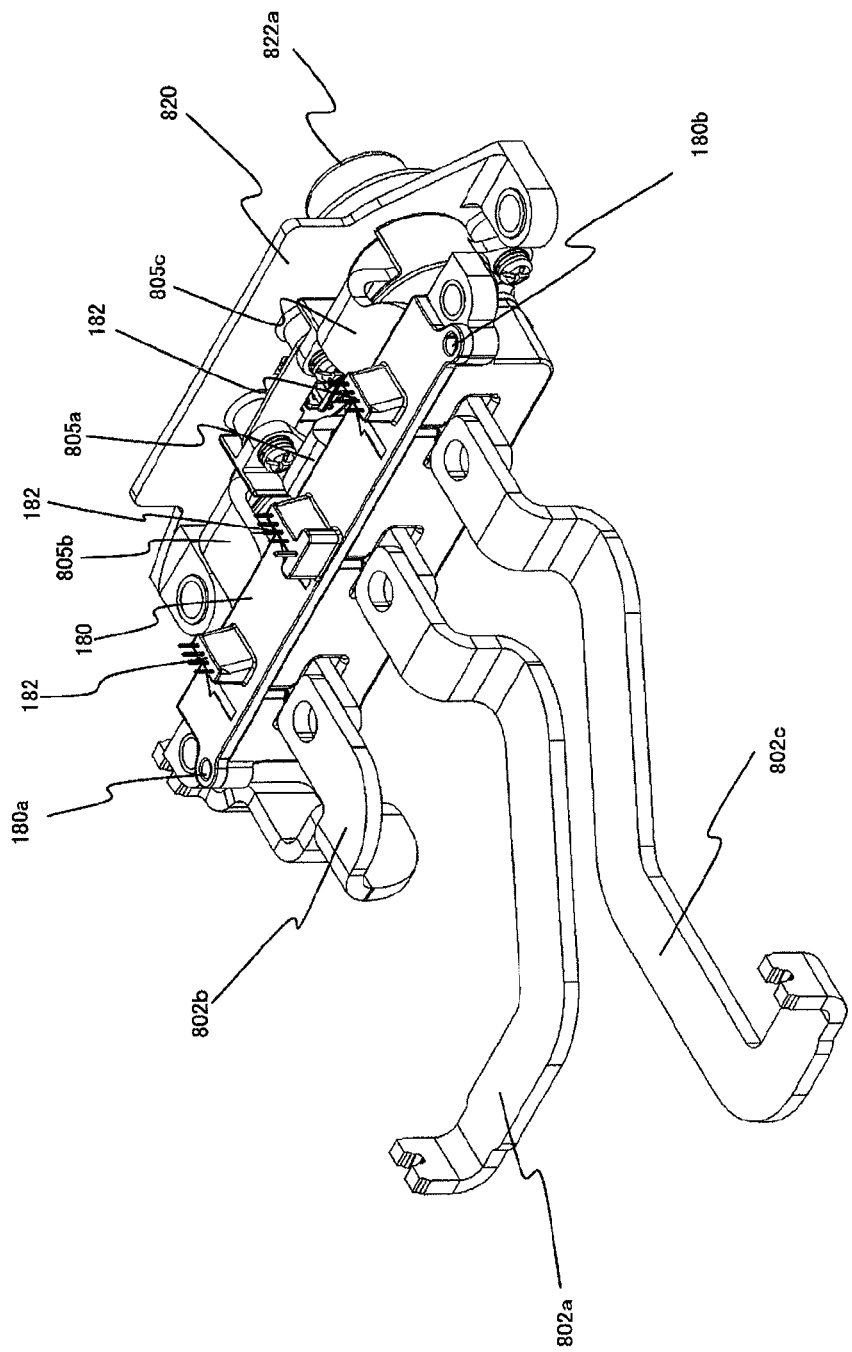
FIG. 19 is a perspective view that illustrates the outer appearance of the busbar assembly 800 from which a holder 803 is eliminated.

FIG. 18 is an exploded perspective view that illustrates the casing 10 in which the power semiconductor modules 300a to 300c and the capacitor module 500 are imposed and the busbar assembly 800. FIG. 19 is a perspective view that illustrates the outer appearance of the busbar assembly 800 from which a holder 803 is eliminated.

Figure 22:
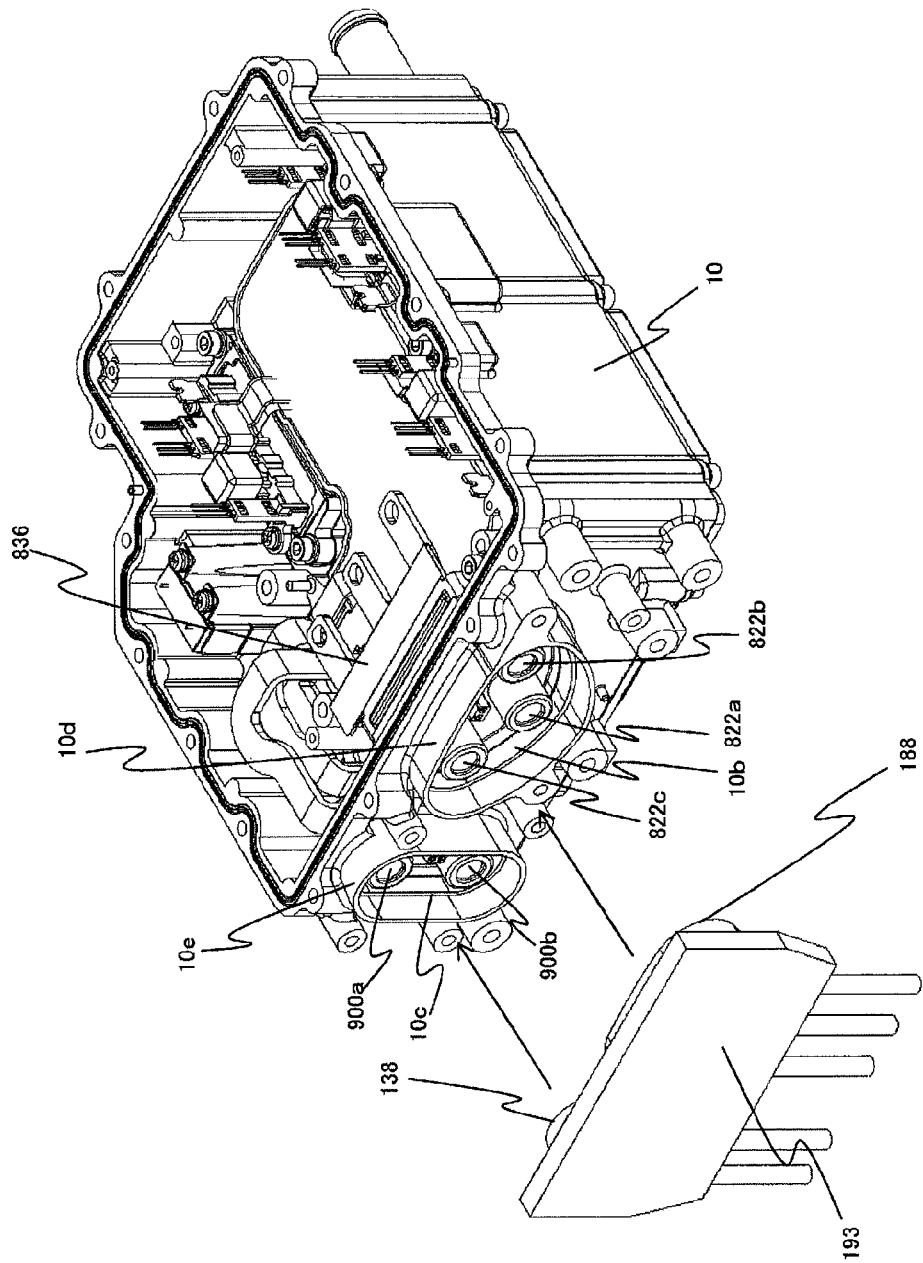
FIG. 22 is an exploded perspective view that illustrates a state in which AC terminals 822a to 822c and DC terminals 900a and 900b are imposed in the casing 10.

As illustrated in FIGS. 18 and 19, the busbar assembly 800 includes AC busbars 802a to 802c, a holder 803 that is used for holding and fixing the AC busbars 802a to 802c, and a support portion that is used for supporting the AC terminals 822a to 822c (see FIG. 22). In addition, in the busbar assembly 800, a current sensor 180 that is used for detecting AC currents flowing through the AC busbars 802a to 802c is disposed.

The AC busbars 802a to 802c are folded back in front of through holes of the current sensor 180 in a direction separating from the capacitor module 500 and are connected to the AC busbars 805a to 805c in front of the holes of the current sensor 180. The AC busbars 805a to 805c are connected to the AC terminals 822a to 822c after passing through the holes of the current sensor 180. As illustrated in FIG. 18, the AC busbars 802a to 802c, the AC busbars 805a to 805c, and the current sensor 180 are held and insulated from each other by the holder 803 made from a resin.

The busbar assembly 800 is fixed to the casing 10 by the holder 803. Accordingly, even in a case where heat is transferred to the casing 10 from the outside, the heat is absorbed by the cooling block 12, and accordingly, an increase in the temperature of the busbar assembly 800 is suppressed. In addition, an increase in the temperature of the current sensor 180 held in the busbar assembly 800 can be suppressed in addition to the suppression of an increase in the temperature of the busbar assembly 800. The current sensor 180 has a property of being vulnerable to heat, and, by employing the above-described structure, the reliability of the current sensor 180 can be improved.

As illustrated in FIG. 18, the holder 803 includes support members 807a to 807d that are used for supporting the driver circuit board 22 illustrated in FIG. 4. In distal end portions of the support members 807a to 807d, screw holes used for fixing the driver circuit board 22 are formed. In addition, the holder 803 includes protruded portions 806a and 806b that extend from a position at which the current sensor 180 is arranged toward the upper side. The protruded portions 806a and 806b pass through holes 180a and 180b (see FIG. 19) formed in the current sensor 180.

As illustrated in FIG. 19, the current sensor 180 includes signal lines 182 that extend in the arrangement direction of the driver circuit board 22. The signal line 182 is bonded to a wiring pattern of the driver circuit board 22 through soldering. In this embodiment, the holder 803, the support members 807a to 807d, and the protruded portions 806a and 806b are integrally formed using a resin.

As described above, by passing the protruded portions 806a and 806b through the holes 180a and 180b, the holder 803 has a function of determining the positions of the current sensor 180 and the driver circuit board 22, and accordingly, an assembly and soldering joint operation between the signal line 182 and the driver circuit board 22 can be easily performed. In addition, by arranging a mechanism that holds the current sensor 180 and the driver circuit board 22 in the holder 803, the number of components of the power inverter can be reduced as a whole.

In this embodiment, since the power inverter 200 is arranged near a vibration source such as an engine, the holder 803 includes the support members 807a and 807b used for supporting a portion located near the center portion of the driver circuit board 22, whereby the influence of the vibration participating to the driver circuit board 22 is reduced. For example, by supporting the center portion of the driver circuit board 22 using the support member 808, the resonance frequency of the driver circuit board 22 can be configured to be higher than the frequency of a vibration transferred from the engine or the like, whereby the influence of the vibration of the engine or the like participating to the driver circuit board 22 can be reduced. In addition, the holder 803 of the busbar assembly 800 is fixed to the casing 10 using a screw 824.

Figure 20:
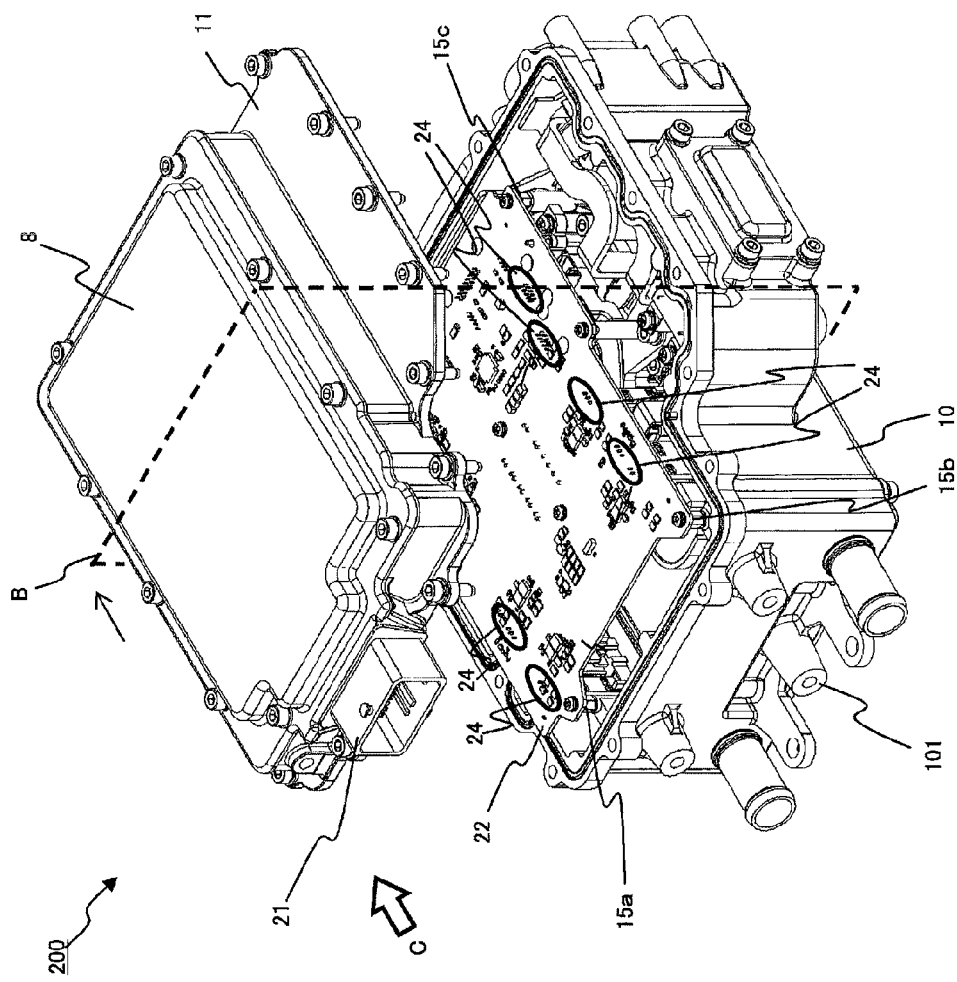
FIG. 20 is a perspective view of the power inverter 200 in a state in which a metal base plate 11 is separated therefrom.
Figure 21:
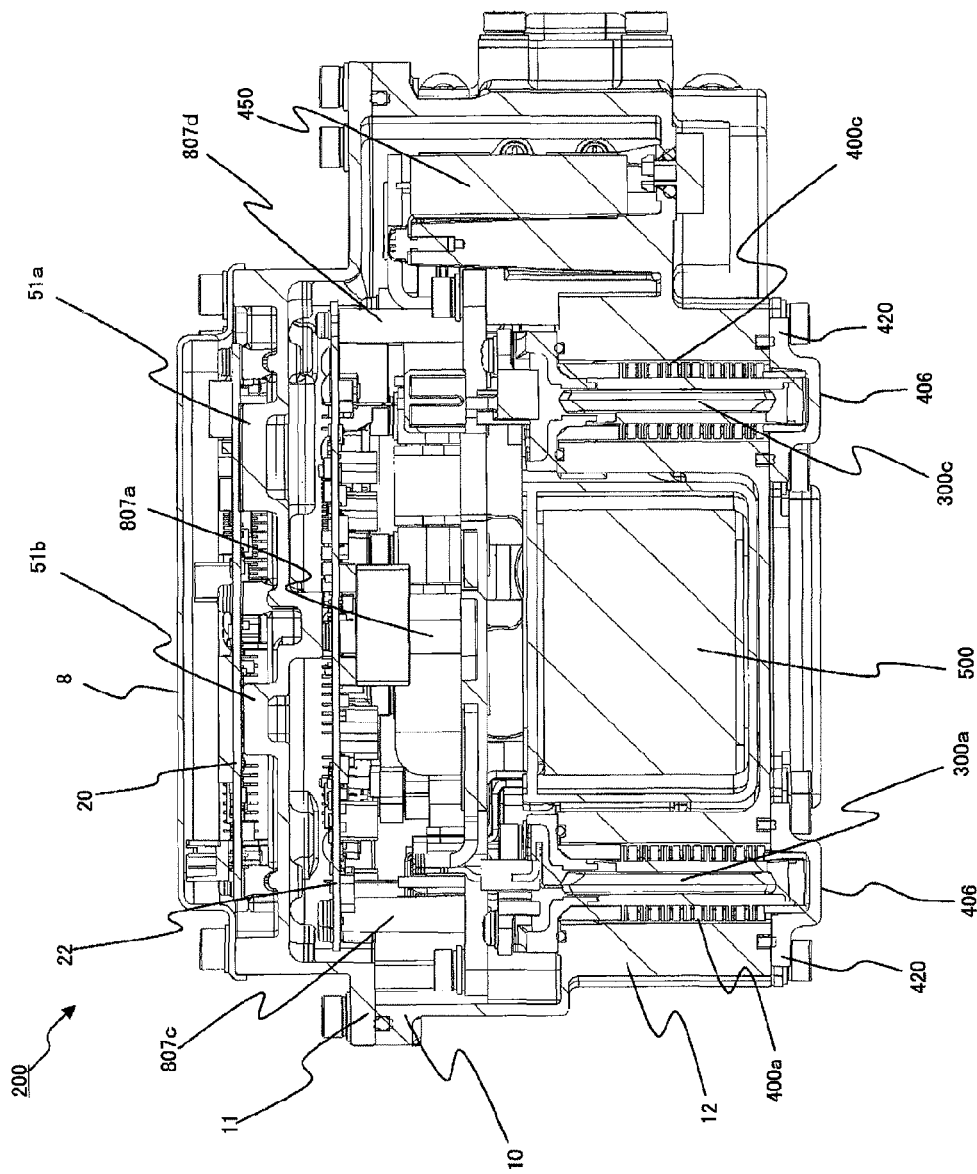
FIG. 21 is a cross-sectional view of the power inverter 200 viewed in a direction of an arrow on a cross-section B illustrated in FIG. 20.

FIG. 20 is a perspective view of the power inverter 200 in a state in which the metal base plate 11 is separated therefrom. FIG. 21 is a cross-sectional view of the power inverter 200 viewed in a direction of an arrow on a cross-section B illustrated in FIG. 20. As illustrated in FIG. 18, the current sensor 180 is arranged on the upper side of the capacitor module 500. The driver circuit board 22 is arranged on the upper side of the current sensor 180 by being supported by the support members 807a to 807d disposed in the busbar assembly 800 illustrated in FIG. 18. In addition, as illustrated in FIG. 20, four corners of the driver circuit board 22 are connected to the casing 10 through the support members 15a to 15d (15d is not illustrated in the figure). The metal base plate 11 is arranged on the upper side of the driver circuit board 22. In this embodiment, the circumferential edge of the opening portion of the casing 10 is closed by the metal base plate 11. The control circuit board 20 is housed in a space that is formed by the metal base plate 11 and the cover 8.

The current sensor 180, the driver circuit board 22, and the control circuit board 20 are arranged in a layered manner in the height direction, and the control circuit board 20 is arranged at a position farthest from the power semiconductor modules 300a to 300c of strong electric fields, whereby mixing of a switching noise or the like can be suppressed. In addition, the metal base plate 11 is electrically connected to the cooling block 12 electrically connected to the ground. By this metal base plate 11, the noise mixed into the control circuit board 20 from the driver circuit board 22 is reduced.

As a structure for electrically connecting the current sensor 180 and the driver circuit board 22 to each other, a structure that can prevent the complication of a connection process using a wiring connector and a connection error is preferable. In this embodiment, as illustrated in FIG. 20, the holes 24 passing through the driver circuit board 22 are formed, the signal terminals 325U and 325L of the power semiconductor modules 300a to 300c are inserted into the holes 24, and the signal terminals 325U and 325L are bonded by a wiring pattern of the driver circuit board 22 and soldering. Here, the soldering joint is performed on the side of the face of the driver circuit board 22 that is a side opposite to a face facing the cooling block 12.

From this, the signal lines can be connected without using wiring connectors, and accordingly, the productivity can be improved. In addition, by employing a structure in which the signal terminals 325U and 325L of the power semiconductor module 300 and the signal line 182 of the current sensor 180 are bonded through soldering in the same direction, the productivity can be further improved.

In addition, in the driver circuit board 22 of this embodiment, driving circuits (not illustrated in the figure) such as driver IC chips are mounted on the side of a face facing the cooling block 12. From this, the transfer of the heat of the soldering joint to the driver IC chip or the like is suppressed, whereby a damage in the driver IC chip or the like due to the soldering joint is prevented. Furthermore, since a high-profile component such as a transformer mounted in the driver circuit board 22 is arranged in a space between the capacitor module 500 and the driver circuit board 22, implementation of a low profile of the power inverter 200 can be performed.

FIG. 22 is an exploded perspective view that illustrates a state in which the AC terminals 822a to 822c and the DC terminals 900a and 900b are imposed in the casing 10 illustrated in FIG. 18. A vehicle-side connector 193 as illustrated in FIG. 22 is connected to the AC terminals 822a to 822c and the DC terminals 900a and 900b.

The casing 10 includes a first wall 10d that protrudes from the circumference of the opening portion 10b toward the outside of the casing 10. The first wall 10d may be formed to be integrated with the casing 10. The AC-side connector 188 passes a space surrounded by the first wall 10d and is connected to the AC terminals 822a to 822c supported by a first support member 820. From this, the AC terminals 822a to 822c are covered with the first wall 10d, and accordingly, the AC terminals 822a to 822c can be protected from a shock transferred from the outside.

In addition, by bringing a protruded portion 832 of the first support member 820 and the first wall 10d into contact with each other in a broad area, the accuracy of the positions of the AC terminals 822a to 822c can be improved, and the resonance frequency of the AC terminals 822a to 822c can be configured to be higher than the frequency of a vibration transferred from the engine or the like. Furthermore, since the AC-side connector 188 is configured to be in contact with the inner periphery of the first wall 10d, the accuracy of the position of the AC-side connector 188 can be improved, and the resonance frequency of the AC wiring of the AC-side connector 188 can be configured to be higher than the frequency of the vibration transferred from the engine or the like.

Similarly, the casing 10 includes a second wall 10e that protrudes from the circumference of the opening portion 10c toward the outside of the casing 10. The second wall 10e may be formed to be integrated with the casing 10. The DC-side connector 138 passes a space surrounded by the second wall 10e and is connected to the DC terminals 900a and 900b supported by a second support member 904. From this, the DC terminals 900a and 900b are covered with the second wall 10e, and accordingly, the DC terminals 900a and 900b can be protected from a shock transferred from the outside. In addition, by bringing the protruded portion 912 of the second support member 904 and the second wall 10e into contact with each other in a broad area, the accuracy of the positions of the DC terminals 900a and 900b can be improved, and the resonance frequency of the DC terminals 900a and 900b can be configured to be higher than the frequency of a vibration transferred from the engine or the like. Furthermore, since the DC-side connector 138 is configured to be in contact with the inner periphery of the second wall 10e, the accuracy of the positions of the DC-side connector 138 can be improved, and the resonance frequency of the DC wiring of the DC-side connector 138 can be configured to be higher than the frequency of the vibration transferred from the engine or the like.

Figure 23:
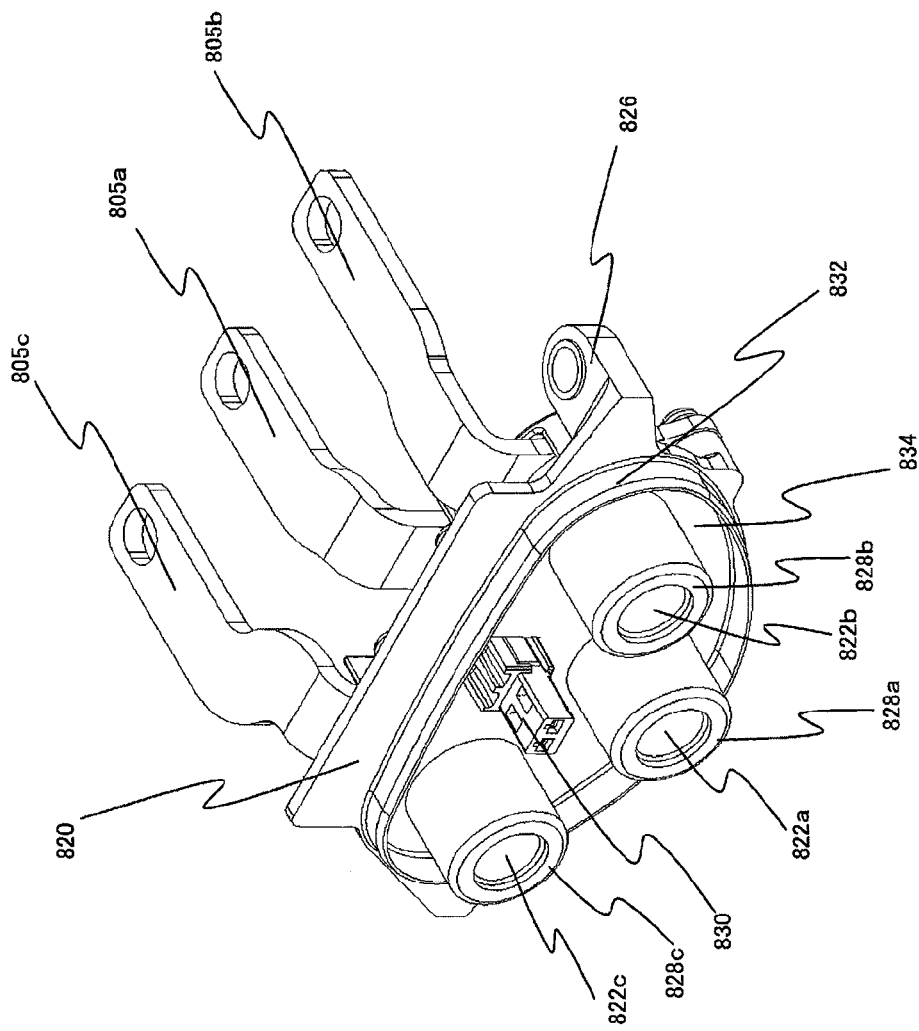
FIG. 23 is an enlarged diagram of peripheral components of the AC terminals 822a to 822c.

FIG. 23 is an enlarged diagram of peripheral components of the AC terminals 822a to 822c. The AC busbars 805a to 805c are busbars used for passing through the current sensor 180 and are supported by the first support member 820, and the distal ends thereof are connected to the AC terminals 822a to 822c. The AC terminals 822a to 822c are female-type connectors having a cylindrical shape. The first support member 820 is fixed to the casing 10 by a fixation portion 826. In addition, the first support member 820 protrudes toward the outside of the casing 10 and includes terminal covering portions 828a to 828c that are configured by covering the distal end portions of the AC terminals 822a to 822c.

The AC terminals 822a to 822c are connected to the vehicle-side connector 193 illustrated in FIG. 22. When the power inverter 200 is carried, is assembled with a vehicle, is tested, or has a component being replaced, the connector 193 is in a separated state, and there is a possibility that the AC terminals are exposed. At that time, while it is necessary to prevent an electric shock due to an operator being brought into contact with the exposed AC terminals 822a to 822c, by employing the above-described configuration, the electric shock can be prevented by covering the distal end portions of the AC terminals 822a to 822c with an insulating material.

In addition, the first support member 820 holds a connection detecting circuit 830. The connection detecting circuit 830 detects the separation of the AC connector 188 illustrated in FIG. 22 from the first support member 820, in other words, the AC connector 188 and the AC terminals 822a to 822c being in a non-electrically connected state. This connection detecting circuit 830 detects a connected state by being fitted to a connection detecting circuit similar thereto disposed on the AC connector 188 side. In a case where it is detected that the AC connector 188 and the AC terminals 822a to 822c are in the non-electrically connected state, the connection detecting circuit 830 delivers the detection information to the control circuit board 20. The control circuit board 20 performs control of driving of the power semiconductor modules 300a to 300c to be suppressed or to be stopped based on the detection information.

The connection detecting circuit 830 configures a circuit using a loop of the control circuit board 20 and the AC terminals, and the control circuit board 200 generates a signal for suppressing or stopping the driving of the power semiconductor modules when one of portions is cut off so as to be in the non-electrically connected state.

By employing the above-described configuration, when the AC terminals 822a to 822c are exposed by an operator removing the vehicle-side connector 193 when the power inverter 200 is assembled with a vehicle, is tested, or has a component being replaced, the driving of the power inverter 200 is stopped, whereby the safety of the operator can be secured. In addition, in order to prevent the driving of the power inverter 200 from being stopped at unexpected timing due to erroneously dropping out of the connection detecting circuit 830 according to a vibration, the connection detecting circuit 830 is supported by the first support member 820 that is strongly fixed to the casing 10.

In addition, the first support member 820 includes the protruded portion 832 protruding toward the outside of the casing 10. The protruded portion 832 is formed so as to surround the AC terminals 822a to 822c and is formed such that the outer periphery of the protruded portion 832 is fitted to the inner edge of the opening portion 10b illustrated in FIG. 5. From this, the position accuracy of the AC terminals 822a to 822c and the inner circumference portion of the opening portion 10b can be improved. Furthermore, the waterproof effect can be improved. Furthermore, since a contact area between the first support member 820 holding the AC terminals 822a to 822c and the casing 10 can be increased much, the resonance frequency of the AC terminals 822a to 822c can be configured to be higher than the frequency of the vibration transferred from the engine or the like. Therefore, the vibration resistance of the periphery of the AC terminals 822a to 822c can be improved.

In addition, the first support member 820 includes a shielding portion 834 that is used for closing the opening portion 10b of the casing 10. The shielding portion 834 is formed so as to be embedded between terminal covering portions 828a to 828c and the protruded portion 832. When only the power inverter 200 is carried, is assembled with a vehicle, is tested, or has a component being replaced, there is a possibility that a foreign material such as a screw or a tool is mixed into the inside of the casing 10 from the outside. The foreign material mixed into the inside of the casing 10 may lead to a formation of a short circuit in an electrically connected portion or a damage in a constituent component, and there is a possibility that the power inverter 200 is broken down. Thus, as in the above-described configuration, by shielding the inside and the outside of the casing 10 using the shielding portion 834, the mixing of a foreign material from the outside can be prevented.

Figure 24:
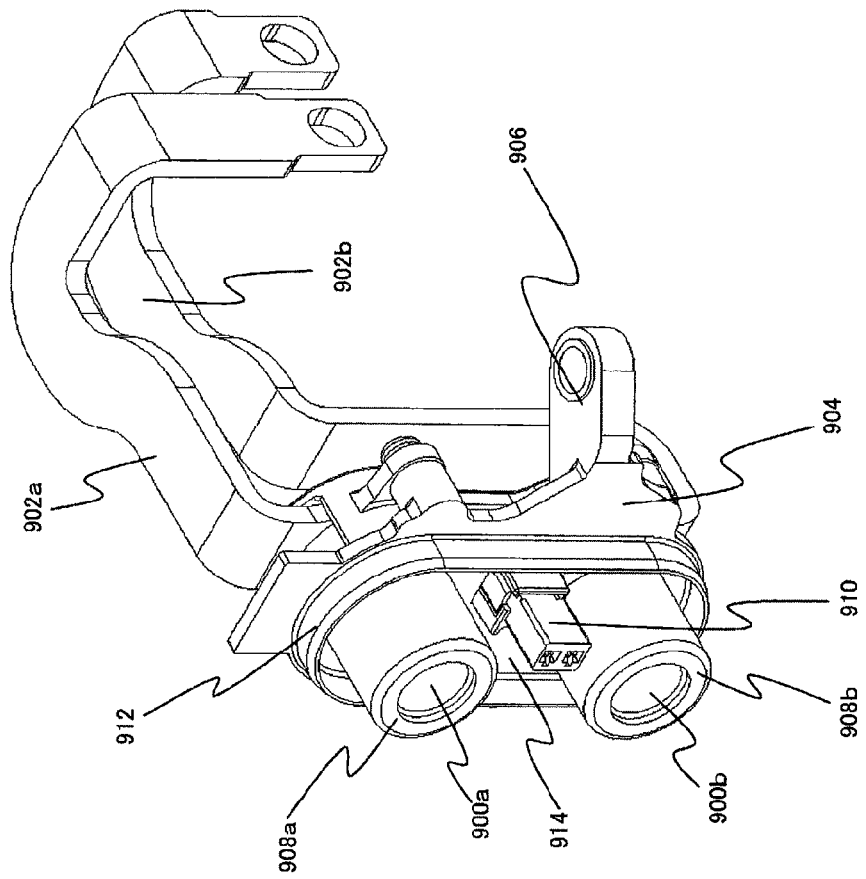
FIG. 24 is an enlarged diagram of peripheral components of the DC terminal 900a disposed on a negative side and the DC terminal 900b disposed on a positive side.

FIG. 24 is an enlarged diagram of peripheral components of the DC terminal 900a disposed on a negative side and the DC terminal 900b disposed on a positive side. The negative-side DC busbar 902a has one distal end connected to the negative-side power source terminal 508 of the capacitor module 500 and one distal end connected to the DC terminal 900a. Similarly, the positive-side DC busbar 902b has one distal end connected to the positive-side power source terminal 509 of the capacitor module 500 and one distal end connected to the DC terminal 900b. The DC terminals 900a and 900b are female-type connectors having a cylindrical shape.

The second support member 904 is fixed to the casing 10 by a fixation portion 906. In addition, the second support member 904 protrudes toward the outside of the casing 10 and includes terminal covering portions 908a and 908b configured by covering the distal end portions of the DC terminals 900a and 900b. The DC terminals 900a and 900b are connected to the vehicle-side connector 193 illustrated in FIG. 22. When the power inverter 200 is carried, is assembled with a vehicle, is tested, or has a component being replaced, the connector 193 is in a separated state, and there is a possibility that the DC terminals are exposed. At that time, while it is necessary to prevent an electric shock due to an operator being brought into contact with the exposed DC terminals 900a and 900b, by employing the above-described configuration, the electric shock can be prevented by covering the distal end portions of the DC terminals 900a and 900b with an insulating material.

In addition, the second support member 904 holds a connection detecting circuit 910. The connection detecting circuit 910 detects the separation of the DC connector 138 illustrated in FIG. 22 from the second support member 904, in other words, the DC connector 138 and the DC terminals 900a and 900b being in a non-electrically connected state. This connection detecting circuit 910 detects a connected state by being fitted to a connection detecting circuit similar thereto disposed on the DC connector 138 side.

In a case where it is detected that the DC connector 138 and the DC terminals 900a and 900b are in the non-electrically connected state, the connection detecting circuit 910 delivers detection information to the control circuit board 20. The control circuit board 20 performs control of driving of the power inverter 200 to be suppressed or to be stopped based on the detection information. In addition, the connection detecting circuit 910 configures a circuit using a loop of the control circuit board 20 and the DC terminals, and the control circuit board 200 generates a signal for suppressing or stopping the driving of the power semiconductor modules when one of portions is cut off so as to be in the non-electrically connected state.

In this embodiment, as described above, the connection detecting circuit 830 is arranged also on the side of the AC terminals 822a to 822, a circuit is configured by a loop between the control circuit board 20, the DC terminals, and the AC terminals, and, when one of portions is cut off so as to be in the non-electrically connected state, the control circuit board 200 is configured to generate a signal for suppressing or stopping the driving of the power semiconductor modules. In addition, as illustrated in FIG. 22, in a case where the connector 193 is configured such that the DC connectors 138 and the AC connectors 188 are integrated, if one of the connection detecting circuits 830 and 910 is disposed, the control for suppressing or stopping the driving of the power inverter 200 can be performed.

By employing the above-described configuration, when the DC terminals 900a and 900b are exposed by an operator removing the vehicle-side connector 193 when the power inverter 200 is assembled with a vehicle, is tested, or has a component being replaced, the driving of the power inverter 200 is stopped, whereby the safety of the operator can be secured. In addition, in order to prevent the driving of the power inverter 200 from being stopped at unexpected timing due to erroneously dropping out of the connection detecting circuit 910 according to a vibration, the connection detecting circuit 910 is supported by the second support member 904 that is strongly fixed to the casing 10.

In addition, the second support member 904 includes the protruded portion 912 protruding toward the outside of the casing 10. The protruded portion 912 is formed so as to surround the DC terminals 900a and 900b and is formed such that the outer periphery of the protruded portion 832 is fitted to the inner edge of the Opening portion 10c illustrated in FIG. 5. From this, the position accuracy of the DC terminals 900a and 900b and the inner circumference portion of the opening portion 10c can be improved. Furthermore, the waterproof effect can be improved. Furthermore, since a contact area between the second support member 904 holding the DC terminals 900a and 900b and the casing 10 can be increased much, the resonance frequency of the DC terminals 900a and 900b can be configured to be higher than the frequency of the vibration transferred from the engine or the like. Therefore, the vibration resistance of the periphery of the DC terminals 900a and 900b can be improved.

In addition, the second support member 904 includes a shielding portion 914 that is used for closing the opening portion 10c of the casing 10. The shielding portion 914 is formed so as to be imbedded between terminal covering portions 908a and 908b and the protruded portion 912. When only the power inverter 200 is carried, is assembled with a vehicle, is tested, or has a component being replaced, there is a possibility that a foreign material such as a screw or a tool is mixed into the inside of the casing 10 from the outside. The foreign material mixed into the inside of the casing 10 may lead to a formation of a short circuit in an electrically connected portion or a damage in a constituent component, and there is a possibility that the power inverter 200 is broken down. Thus, as in the above-described configuration, by shielding the inside and the outside of the casing 10 using the shielding portion 914, the mixing of a foreign material from the outside can be prevented.

Referring back to FIG. 22, the metal plate 836 is a member that is used for fixing the first support member 820 to the casing 10 by interposing the first support member 820 between the casing 10 and the metal plate 836. This metal plate 836 is formed so as to cover at least a part of the face of the AC busbars 822a to 822c on a side on which the control circuit board 20 illustrated in FIG. 4 is arranged. The control circuit board 20 and the wiring used for transferring a control signal may be easily influenced by a noise transmitted from the AC terminals 822a to 822c or the AC busbars 805a to 805c due to a weak current. Thus, by surrounding the AC terminals 822a to 822c and the AC busbars 805a to 805c using the metal plate 836 that is a conductive member, a noise can be blocked.

In this embodiment, the connector 193 is configured to be integrated with the DC connector 138 and the AC connector 188. From this, the number of components can be reduced, and the connection operation can be simplified, whereby the productivity is improved. However, since the DC connectors 138 and the AC connectors 188 are attached to one side altogether, the connector 193 is formed to be large and may be easily distorted, whereby there is a concern that the insertion stress of the connector 193 is biased. As a result, there is a concern that the connector 193 or the components of the power inverter 200 may be damaged or the waterproof property may be degraded due to deviation of a sealing member between the connector 193 and the casing 10. In addition, when the connector 193 and the power inverter 200 are mounted in a vehicle in the state in which the insertion stress of the connector 193 is biased, there is concern that the required capability of the vibration resistance may not be acquired.

Figure 25:
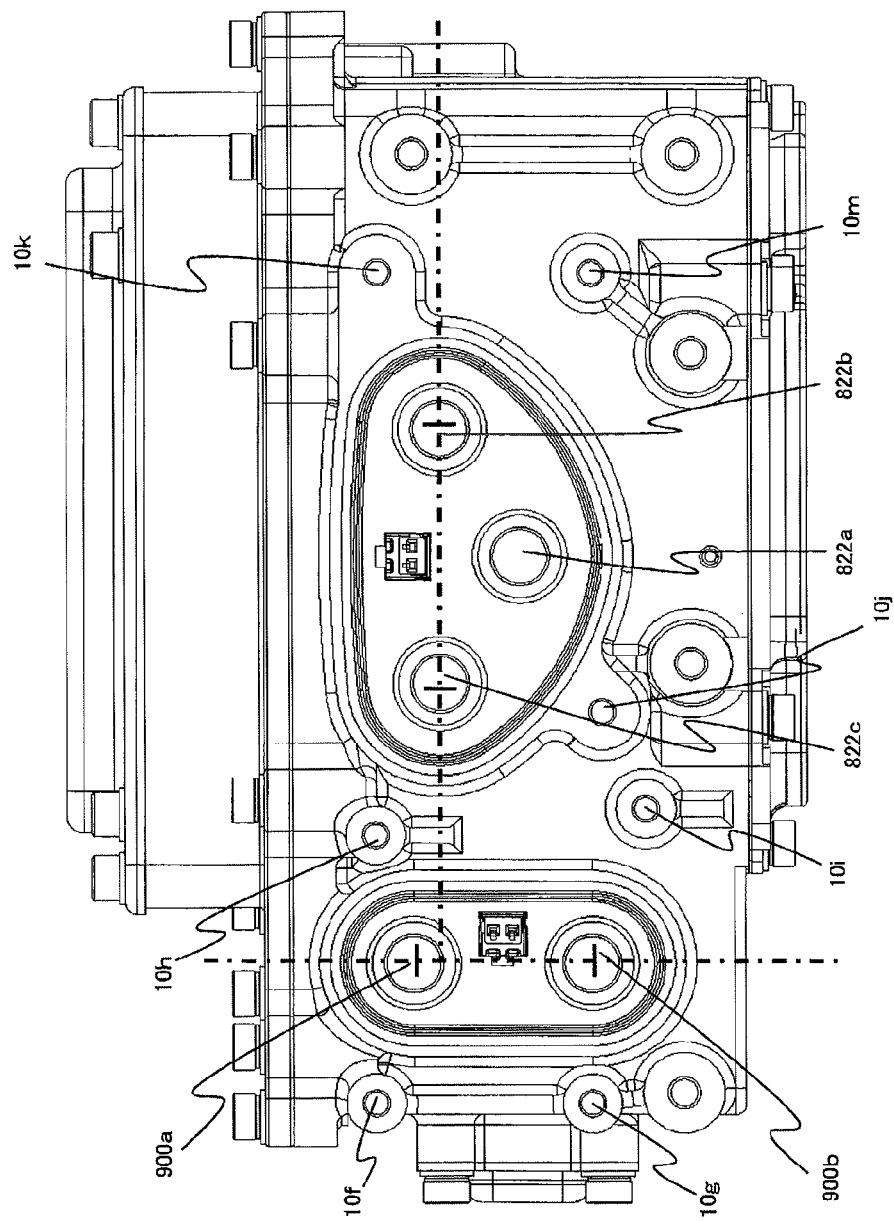
FIG. 25 is a side view of the casing 10 viewed from the side on which the AC terminals 822a to 822c and the DC terminal 900a are arranged.

Thus, the AC terminals 822a to 822c and the DC terminals 900a and 900b according to this embodiment are arranged such that the distortion of the connector 193 in which the DC connector 138 and the AC connector 188 are integrally configured is reduced. More specifically, as illustrated in FIG. 25, the AC terminals 822a to 822c and the DC terminals 900a and 900b are arranged on one side face of the casing 10, and one side face of the casing 10 forms a rectangular shape configured by sides in the direction of shorter sides and sides in the longitudinal direction. In addition, the DC terminals 900a and 900b are arranged to be aligned along one side of one side face of the casing 10 in the direction of the shorter side, and the AC terminals 822a to 822c are arranged to be aligned along one side of one side face of the casing 10 in the longitudinal direction.

Accordingly, an approximate letter "T" inclined by 90 degrees or an approximate letter "L" is formed by a segment passing through the DC terminals 900a and 900b and a segment passing through the AC terminals 822a and 822c. Therefore, the positioning of the connector 193 in the height direction (the direction of the shorter side of one side face of the casing 10) and the widthwise direction (the longitudinal direction of one side face of the casing 10) are simultaneously performed, and the connector 193 can be fixed to each terminal and the casing 10 such that the insertion stress of the connector 193 is not biased.

In addition, since an extreme increase in the length of the connector 193 in the height direction or the widthwise direction is suppressed, the distortion of the connector 193 can be reduced, and the bias of the insertion stress of the connector 193 is reduced. In addition, since an extreme increase in the length of the connector 193 in the height direction or the widthwise direction is suppressed, distances between connector fixation portions 10f to 10m can be shortened. From this, the resonance frequency of the connector 193 and the casing 10 can be configured to be higher than the frequency of the vibration transferred from the engine or the like, whereby the vibration resistance of the vehicle can be improved.

In addition, in this embodiment, the AC terminal 822b is arranged to be closer to the other side of one side face of the casing 10 in the longitudinal direction than the AC terminals 822a and 822c. In accordance with such an arrangement, the first support member 820 and the first wall 10d form an inverted triangle shape having a gentle angle. From this, extreme increases in the lengths of the AC connector 188 and the connector 193 in the height direction or the widthwise direction are suppressed, whereby advantages of improving the connection reliability and the vibration resistance as described above are acquired.

(Countermeasure of Noise)

Next, an EMC (Electro Magnetic Compatibility) measure in this embodiment will be described. The EMC (Electro Magnetic Compatibility) represents to have both properties including that an electrical noise generated by a device does not have an adverse electrical effect on a small periphery and, even in a case where an electrical noise to some degrees is applied from the outside, a device withstands the noise without any malfunction. Generally, the EMC measure is also called an electromagnetic wave noise measure.

Figure 2:
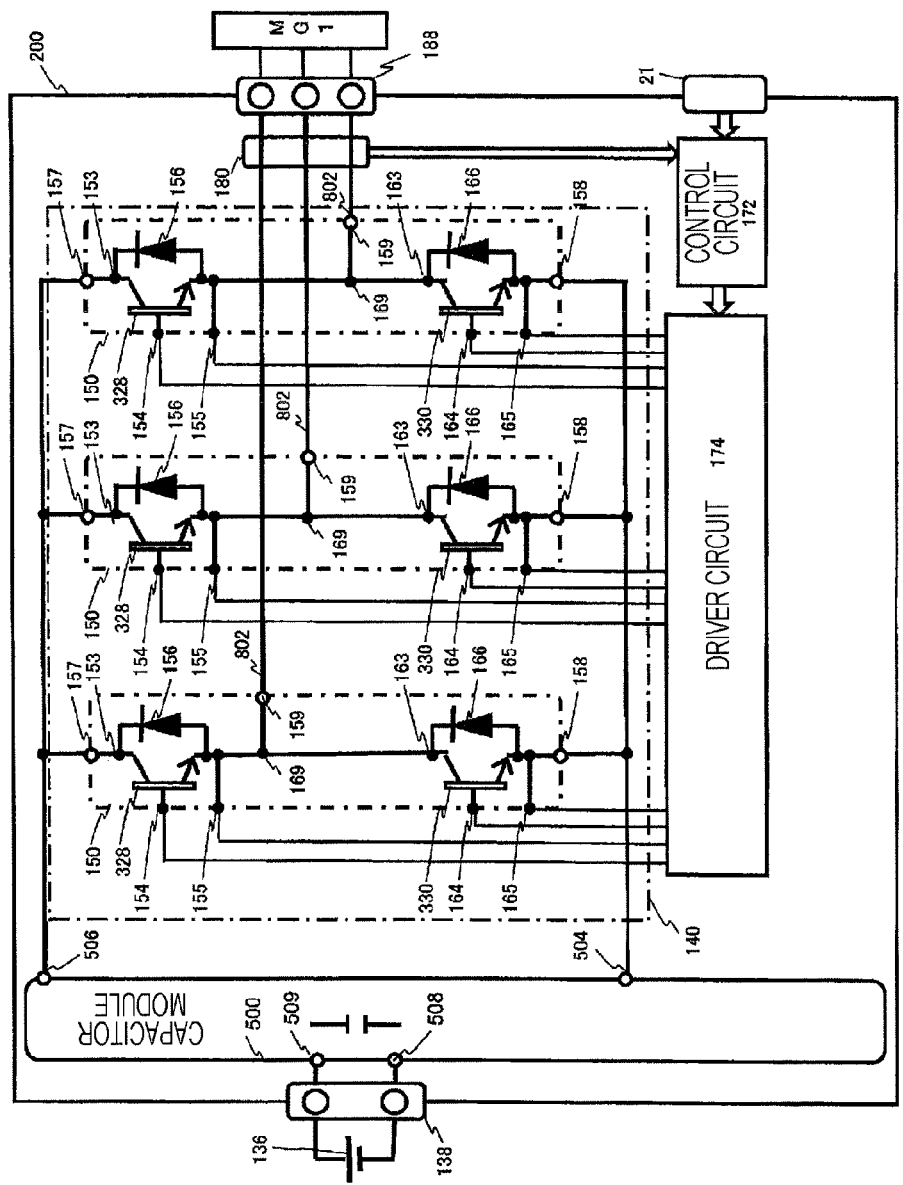
FIG. 2 is a circuit diagram that illustrates the configuration of an electrical circuit illustrated in FIG. 1.

As illustrated in FIG. 2, in the power inverter 200, by causing switching power semiconductor devices (IGBTs 328 and 330) disposed in the power semiconductor modules 300a to 300c to perform switching operations, DC power supplied from the battery 136 is converted into AC power, and the converted AC power is supplied to the motor generator MG1. When the switching described above is performed, a harmonic current component of the switching frequency is generated in accordance with a rise in the voltage/current at the time of switching. Accordingly, in the power inverter 200 according to this embodiment, constituent components of high electric fields including the power semiconductor module 300 and the busbars (the AC busbar and the DC busbar) that are noise generation sources and a control circuit board 20 of a weak electric field on which the influence of an electromagnetic noise is desired to be suppressed are arranged in mutually-different housing spaces through electromagnetic shielding.

More specifically, as illustrated in FIGS. 16, 18, 20, and 21, the power semiconductor modules 300a to 300c are arranged in the cooling block 12 disposed on the lower side of the casing 10. The capacitor module 500 is arranged on the center of the lower portion of the casing 10 so as to be surrounded by the cooling block 12. On the upper side of the capacitor module 500, the busbar assembly 800 is arranged, and the driver circuit board 22 is arranged in the upper portion of the busbar assembly 800. As above, inside the casing 10 made of metal (for example, aluminum), constituent components of strong electric fields are arranged in a layered manner. In addition, the control circuit board 20 is arranged in the upper portion of the metal base plate 11 as an electromagnetic shield.

By employing a layered arrangement as above and arranging the control circuit board 20 at a position farthest from the power semiconductor modules 300a to 300c of strong electric fields, mixing of a switching noise or the like is suppressed. In addition, a noise mixed into the control circuit board 20 is reduced by the metal base plate 11.

In the casing 10, separated from the housing space having an approximate rectangular parallelepiped in which the busbar assembly 800, the power semiconductor modules 300a to 300c, and the like are housed, the protruded housing portion 10a (see FIG. 4) in which the DC busbars 902a and 902b and the resistor 450 are housed is formed so as to protrude to the side of the housing space. This protruded housing portion 10a and the opening portion of the casing 10 having the above-described rectangular parallelepiped housing space are closed by the metal base plate 11 fixed to the casing 10. Since the metal base plate 11 is formed by using a metal or a conductive resin (for example, polycarbonate containing carbon or a resin containing a metal fiber), the metal base plate 11 serves as an electromagnetic shield for the protruded housing portion 10a and the housing space having an approximate rectangular parallelepiped, thereby preventing that an electromagnetic noise transmitted from a constituent component of a strong electric field leaks to the outside, or an electromagnetic noise transmitted from the outside penetrates into the housing space.

Figure 26:
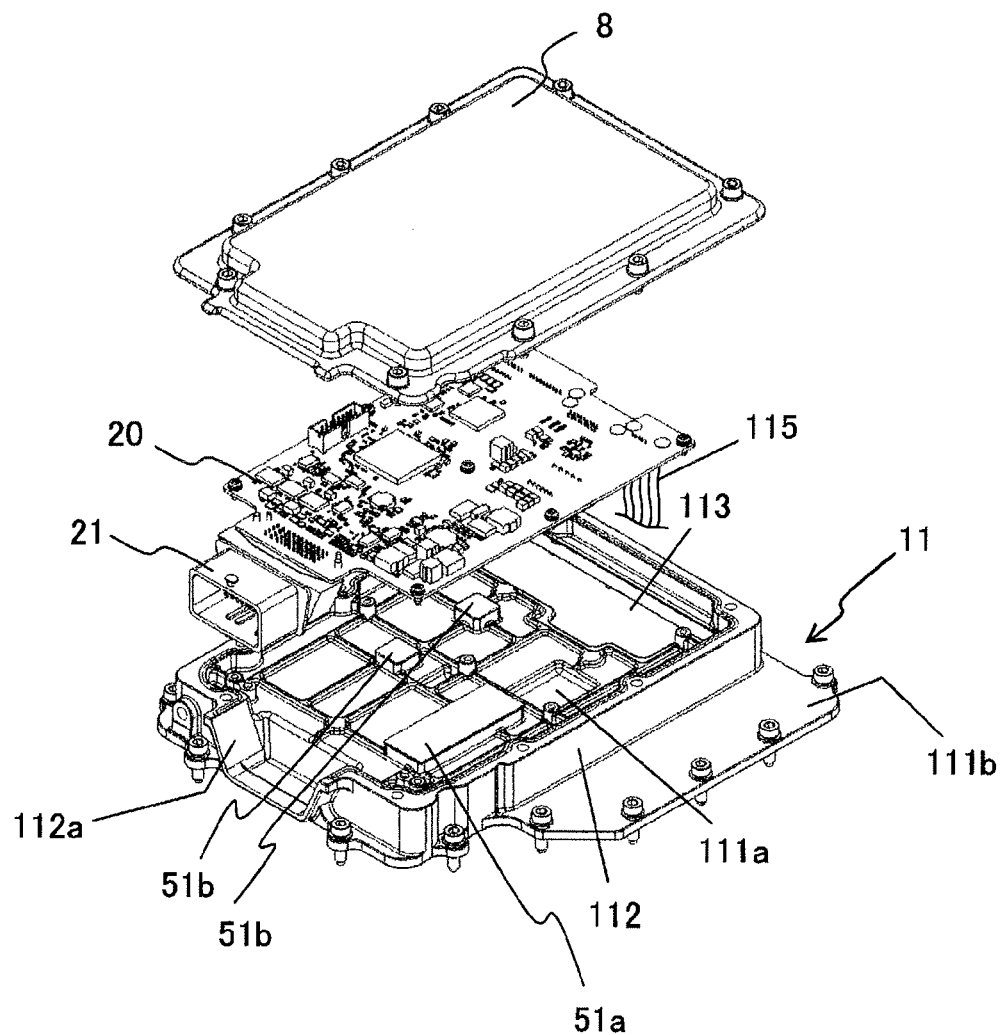
FIG. 26 is a perspective view that illustrates a metal base plate 11, a control circuit board 20 housed in the metal base plate 11, and a cover 8 fixed to an upper part of the metal base plate 11.

FIG. 26 is a perspective view that illustrates the metal base plate 11, the control circuit board 20 housed in the metal base plate 11, and the cover 8 fixed to an upper part of the metal base plate 11. The metal base plate 11 includes a base portion 111a to which the control circuit board 20 having an approximate rectangular shape is fixed, a wall portion 112 that is disposed so as to surround the periphery of the base portion 111a, and a second base portion 111b that covers the upper portion (opening portion) of the protruded housing portion 10a. The base portions 111a and 111b and the wall portion 112 are integrally formed, and the cover 8 serving as an electromagnetic shield is fixed to the upper portion of the wall portion 112. The cover 8 is formed by using a conductive member such as a metal. Convex portions 51a and 51b are formed on the upper face of the base portion 111a, and, as illustrated in FIG. 21, by bringing the base portion 111a into contact with the lower face of the control circuit board 20 directly or indirectly through a member (for example, a heat dissipating sheet), the heat of electronic components mounted on the board can be dissipated to the convex portions 51a and 51b.

As above, by covering the control circuit board 20 with the wall portion 112 and the cover 8, penetration of a noise from the outside is prevented. The metal base plate 11 is electrically connected to the casing 10 that is electrically connected to the ground, the wall portion 112 is erected from the base portion 111a as one body, and the cover 8 is fixed to the wall portion 112, and accordingly, a structure is formed in which an electromagnetic noise can easily fall from the wall portion 112 to the casing 10. In addition, an earth connecting portion 101 (see FIG. 20) disposed in a lower portion of the side face of the casing 10 is connected to the earth arranged on the vehicle side.

In the base portion 111a, an opening portion 113 that is used for letting a wiring 115 between the driver circuit board 22 and the control circuit board 20 to pass is formed. As the wiring 115, there is a wiring for a power module control signal, a wiring for a current sensor signal, a wiring for a discharge circuit control signal, or the like. In such wirings, a wiring material such as a flat cable is used, and a connection connector is disposed on a face side of the control circuit board 20 that faces the opening portion 113. The connector is arranged along one side of the control circuit board 20 that forms an approximate rectangle, and the opening portion 113 formed in the base portion 111a is formed to be fine and long along one side of the wall portion 112 surrounding all the sides of the control circuit board 20. The opening portion 113 becomes a penetration path of an electromagnetic noise, is preferably small as much as possible, and thus is formed in a fine and long rectangular shape in which the width of one side is smaller than that of the other side perpendicular thereto.

On the other side of the control circuit board 20, in other words, on a side that is located on a side opposite to the opening portion 113, the connector 21 used for transmitting/receiving signals between the control circuit board 20 and an external device is disposed. As above, by arranging the connector 21 on a side opposite to the opening portion 113, the connector 21 can be located far from the opening portion 113, which is an electromagnetic noise penetration portion, whereby the penetration of a noise into the connector 21 can be reduced.

In addition, the connector 21 is fixed to be fitted with a "U" shaped notch portion 112a formed in the wall portion 112 of the metal base plate 11. Near the upper face of the connector 21, the edge portion of the cover 8 fixed to the metal base plate 11 is located. As above, the periphery of the base of the connector 21 is surrounded by the notch portion 112a of the wall portion 112 and the edge of the cover 8. When a plug is attached to or detached from the connector 21, in a case where an unnecessary force is applied in the vertical or horizontal direction of the connector 21, the movement is suppressed by the notch portion 112a and the edge of the cover 8, and accordingly, the strength of the connector 21 is improved.

Figure 27:
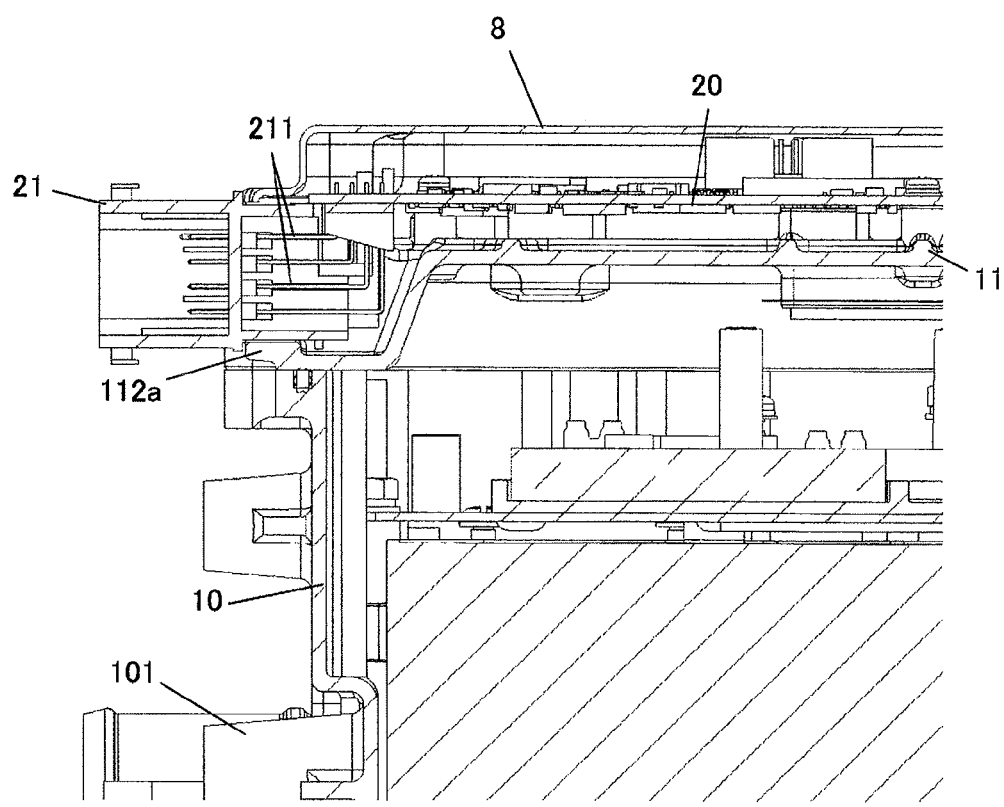
FIG. 27 is a cross-sectional view that illustrates a part of a connector 21 in an enlarged scale.

FIG. 27 is a cross-sectional view that illustrates a part of the connector 21 in an enlarged scale. In the connector 21, a plurality of L-shaped lead wirings 211 are assembled, and, by inserting the lead wirings 211 into holes of the control circuit board 20 and soldering the lead wirings, the connector 21 is attached to the control circuit board 20. Generally, in many cases, the lead wiring 211 has an exposed metal portion and may be easily influenced by a noise from the periphery thereof. Accordingly, the connector 21 is disposed such that the attachment position of the connector 21 is on a side opposite to the opening portion 113 described above.

In addition, generally, the casing 10 of the power inverter 200 is connected to the earth on a further bottom side than that of the casing 10. In this embodiment, the earth connection portion 101 disposed in a lower portion of the side face of the casing 10 is configured to be connected to the earth on the vehicle side. The earth is a reference electric potential and is stabilized the most, and, as an electric potential is separated away from the reference electric potential, the electric potential becomes more unstable for a high frequency. Accordingly, in the power inverter 200 according to this embodiment, the cover 8 is the most unstable in terms of the electric potential. The cover 8 is formed by a conductive member such as a metal. In a case where an electromagnetic noise is received from the outside of the device, the electric potential of the cover 8 changes, and about 1 to 10% of the electromagnetic noise reradiates in the space in which the control circuit board 20 is housed.

Accordingly, in this embodiment, the lead wiring 211 is attached to the lower side of the control circuit board 20, and the lead wiring 211 is arranged in a space between the control circuit board 20 and the metal base plate 11. In the control circuit board 20, a multi-layer board is used, and a ground pattern and the like are formed, and accordingly, the rear face side is stabilized in terms of the electric potential against an electromagnetic noise on the cover 8 side. In addition, the rear face side space in which the lead wiring 211 is arranged is shielded from an electromagnetic noise transmitted from a strong electric field by the metal base plate 11. As a result, the influence of the noise on the lead wiring 211 can be reduced.

For example, in a case where the connector 21 is attached such that the lead wiring 211 is on the upper face side of the control circuit board 20, a noise may be easily applied to the lead wiring 211 that is in the exposed state. There is concern that the noise penetrates into the control circuit board 20 side or flows to an external device through a wiring connected to the connector 21. Since an electric signal flowing through the lead wiring or the like is weak, the electric signal may be easily influenced by a noise. In the case of this embodiment, such an influence can be reduced.

Figure 28:
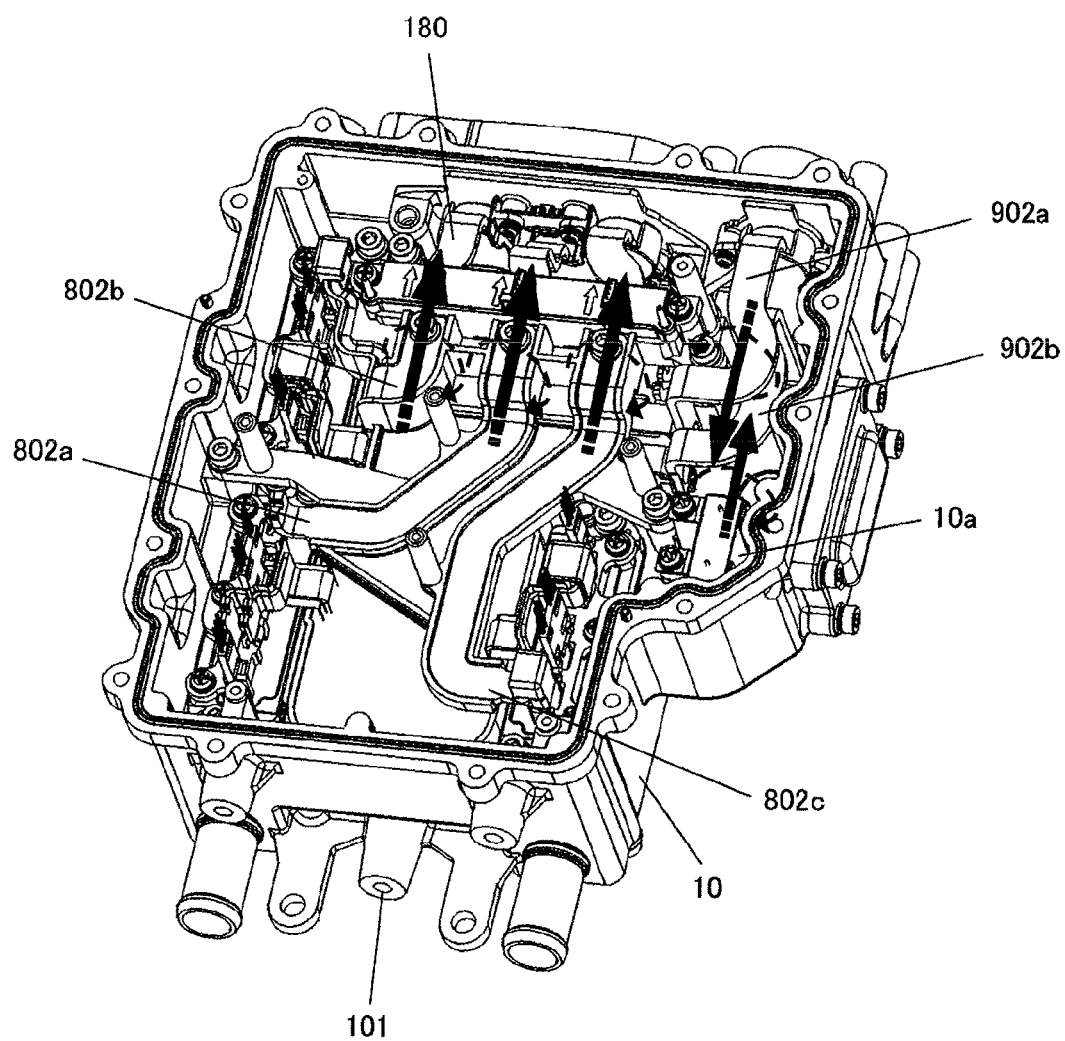
FIG. 28 is a diagram that illustrates the arrangement of AC busbars 802a to 802c and DC busbars 902a and 902b disposed inside the casing 10.

FIG. 28 is a diagram that illustrates the arrangement of the AC busbars 802a to 802c and the DC busbars 902a and 902b disposed inside the casing 10. As illustrated in FIG. 19, the AC busbars 802a to 802c are connected to the AC busbars 805a to 805c that pass through the current sensor 180. The DC busbars 902a and 902b are arranged to be parallel in the vertical direction inside the casing 10. As illustrated in FIG. 22, the AC terminals 822a to 822c and the DC terminals 900a and 900b are arranged on one side face of the casing 10, and the AC busbars 802a to 802c and the DC busbars 902a and 902b are connected to the AC terminals 822a to 822c and the DC terminals 900a and 900b in the state being parallel to each other.

The above-described connection 21 is arranged on a side opposite to the side face on which the AC terminals 822a to 822c and the DC terminals 900a and 900b are disposed. Accordingly, a portion of the AC busbar in which the current sensor 180 is disposed is arranged at a position facing the opening portion 113 of the above-described metal base plate 11. The longitudinal direction of the opening portion 113 forming an approximate rectangle is perpendicular to the extending direction of the AC busbars 802a to 802c. Arrows denoted by solid lines illustrated in the portion of each busbar represent the flows of the currents and the arrows denoted by dotted lines represent the directions of magnetic fluxes. In addition, the directions of currents flowing through the AC busbars 802a to 802c differ in accordance with switching timing, and, when instantly seen, currents do not simultaneously flow through all the AC busbars 802a to 802c, and a current flows through one or two busbars.

As described above, when switching operations are performed in the power semiconductor modules 300a to 300c, a harmonic current component of the switching frequency is generated in accordance with a rise in the voltage/current at the time of switching, and a current including the harmonic current component flows through the AC busbars 802*a* to 802*c*. The harmonic current component becomes a noise current. Since the currents flowing through the AC busbars 802*a* to 802*c* are supplied through the DC busbars 902*a* and 902*b*, at the timing when a current flows through the AC busbar, simultaneously, currents flow through the DC busbars 902*a* and 902*b*.

The noise current flowing through the AC busbars 802*a* to 802*c* generates concentric magnetic fields having the direction in which the current flows as its axis. For example, as illustrated in FIG. 29, in a case where a conductive plate 31 is present near the AC busbars 802*a* to 802*c*, when a changing magnetic field 32 according to a change in the noise current 35 interlinks the conductive plate 31, an induced current 33 so as to offset a change in the magnetic field 32 is generated in the conductive plate 31.

Figure 29:
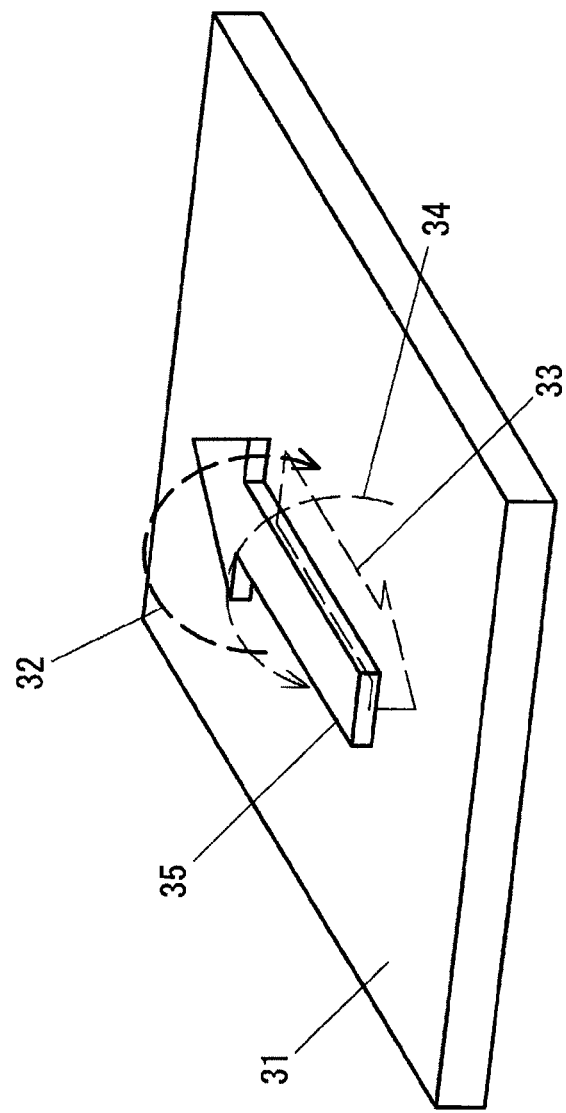
FIG. 29 is a diagram that illustrates a magnetic shield effect according to a conductive plate 31.
Figure 30:
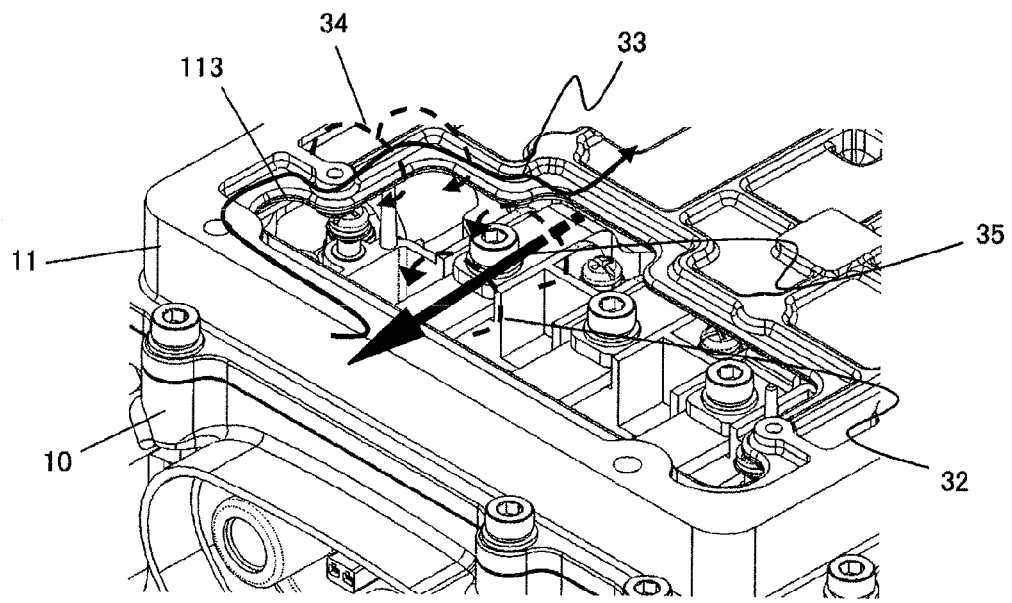
FIG. 30 is a diagram that illustrates an induced current 33 bypassing an opening portion 113.

Since the metal base plate 11 is also formed by a conductive member, an induced current as in the case of FIG. 29 is induced in the metal base plate 11. However, in the opening portion 113 of the metal base plate 11, as illustrated in FIG. 30, the induced current 33 flows with the opening portion 113 being bypassed. Accordingly, the magnetic field 32 of the noise current 35 flowing through the AC busbars 802*a* to 802*c* and the magnetic field of the induced current 33 bypassing the opening portion 113 do not offset each other. As a result, when the magnetic fields (the magnetic field 32 according to the noise current and the magnetic field 34 according to the induced current 33) not offsetting each other interlink the control circuit board 20, a noise is generated and becomes a cause for a noise leaking to the outside of the device. In addition to this, when the induced current flows through the metal base plate 11, a voltage drop occurs, a voltage change according to the voltage drop increases by an amount corresponding to a detour path, and the voltage change becomes a cause of a noise. Accordingly, it is necessary to shorten the length of the detour path as much as possible.

In order to suppress a magnetic field leaking from the opening portion 113, the AC busbars 802*a* to 802*c* need to be arranged so as to shorten the length of a path, which is parallel to the noise current, of an induced current detour path when the AC busbars 802*a* to 802*c* pass through the lower side of the opening portion 113. Accordingly, in this embodiment, the AC busbars 802*a* to 802*c* are arranged so as to be perpendicular to the longitudinal direction of the fine and long opening portion 113. As a result, the magnetic field leaking from the opening portion 113 can be reduced much, and a noise according to a voltage drop can be suppressed by an amount corresponding to a decrease in the detour path, whereby the influence of the noise on the control circuit board 20 can be reduced.

In the description presented above with reference to FIG. 29, it has been described that, when a conductive plate is present near the AC busbars 802*a* to 802*c*, an induced current flows through the conductive plate, and the electromagnetic noise is reduced. Thus, by assigning the role of this conductive plate to another AC busbar, the penetration of an electromagnetic noise from the opening portion 113 into a space in which the control circuit board 20 is disposed can be suppressed. Hereinafter, description will be presented with the AC busbars 802*a* to 802*c* illustrated in FIG. 28 being assumed to be a U-phase busbar, a V-phase busbar, and a W-phase busbar in order.

Figure 31:
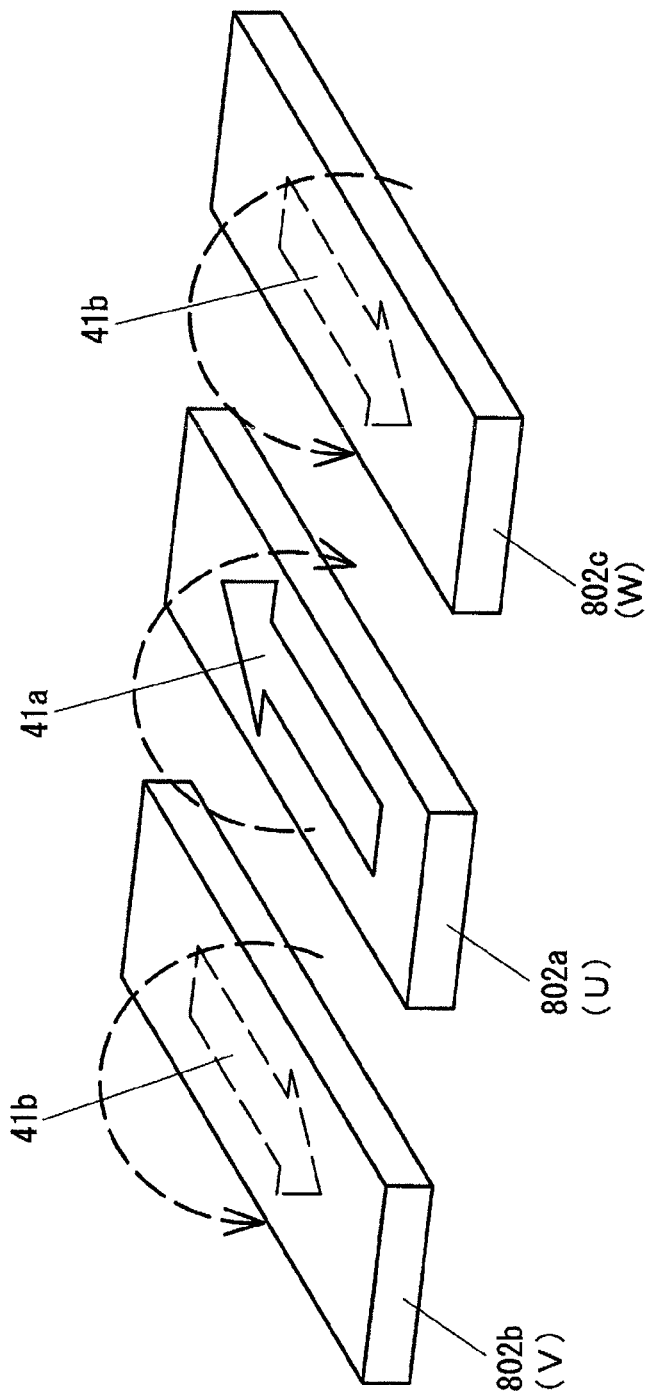
FIG. 31 is a diagram that illustrates a U-phase busbar 802a, a V-phase busbar 802b, and a W-phase busbar 802c.

FIG. 31 is a diagram that illustrates the U-phase busbar 802*a*, the V-phase busbar 802*b*, and the W-phase busbar 802*c* of the part of the opening portion 113, and the busbars are parallel to each other in this embodiment. As denoted by an arrow 41*a*, when a noise current flows through the U-phase busbar 802*a*, a magnetic field as denoted by a broken line 42*a* is generated. This magnetic field 42*a* interlinks the V-phase busbar 802*b* and the W-phase busbar 802*c* that are adjacent thereto, and induced currents in the opposite direction are generated in the V-phase busbar 802*b* and the W-phase busbar 802*c*, as denoted by arrows 41*b*. The electromagnetic noise as a whole decreases, and the penetration of the electromagnetic noise into the space in which the control circuit board 20 is arranged through the opening portion 113 can be reduced.

The effect of reducing the noise according to such induced currents is the highest in a case where three busbars 802*a* to 802*c* are parallel to each other. In other words, when the relation of the arrangement of the opening portion 113 and the AC busbar described above is considered, it is the most preferable that three busbars 802*a* to 802*c* be arranged to be parallel to each other in a direction directly running in the longitudinal direction of the opening portion 113. In the example illustrated in FIG. 31, while a case where a current flows only through the U-phase busbar 802*a* is illustrated, the noise can be reduced as above also in a case where a current flows through any one busbar or two busbars.

As illustrated in FIG. 28, the DC busbars 902*a* and 902*b* are arranged to be parallel to each other in the vertical direction in the protruded housing portion 10*a*. As described above, when a noise current flows through the AC busbars 802*a* to 802*c*, a noise current simultaneously flows also through the DC busbars 902*a* and 902*b*. In such a case, the directions of the currents are opposite in the DC busbars 902*a* and 902*b*, and accordingly, magnetic fields thereof offset each other, whereby the generation of an electromagnetic noise according to the noise current can be suppressed. In addition, also between the AC busbars 802*a* to 802*c* and the DC busbars 902*a* and 902*b* having parallel relation, in a type of the busbars in which the directions of the currents are opposite, the magnetic fields offset each other, and the electromagnetic, noise can be reduced.

In addition, as illustrated in FIG. 20, the protruded housing portion 10*a* in which the DC busbars 902*a* and 902*b* are disposed, the AC busbars 802*a* to 802*c* and the driver circuit board 22 are formed to be deviated to the side in the housed space. The base portion 111*a* in which the control circuit board 20 is arranged is located on the upper side of the driver circuit board 22 as illustrated in FIG. 21, and the opening of the protruded housing portion 10*a* in which the DC busbars 902*a* and 902*b* are housed is closed by the base portion 111*b* of the metal base plate 11. As above, since the DC busbars 902*a* and 902*b* are located not a position right below the opening portion 113 but a position deviated to the side from the right-below position, an electromagnetic noise caused by the noise current flowing through the DC busbars 902*a* and 902*b* hardly penetrates into the area in which the control circuit board 20 is disposed through the opening portion 113. In addition, an electromagnetic noise toward the upper side from the DC busbars 902*a* and 902*b* is shielded by the base portion 111*b*, whereby leakage of the electromagnetic noise to the outside is prevented.

As described in the description presented with reference to FIG. 28, in this embodiment, the current sensor 180 is arranged so as to be located right below the opening portion 113. This configuration also contributes to the effect of reducing the penetration of the electromagnetic noise in the opening portion 113. By detecting the intensity of a magnetic field using a Hall sensor using the current sensor 180, the current flowing through the AC busbars 805*a* to 805*c* (802*a* to 802*c*) is detected.

Figure 32:
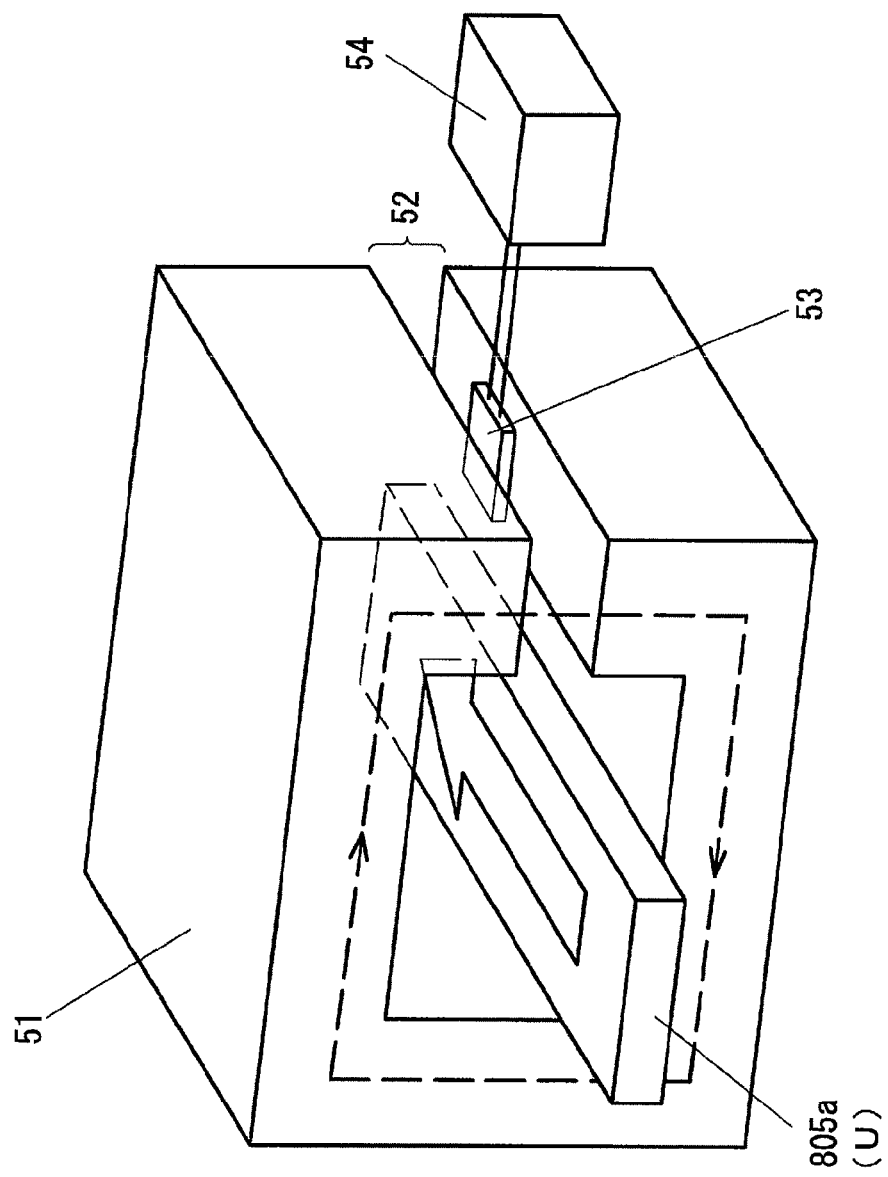
FIG. 32 is a schematic diagram that illustrates the configuration of a detection unit of a current sensor 180.

FIG. 32 schematically illustrates the configuration of a detection unit of the current sensor 180. The AC busbar 805*a* is a busbar that is disposed so as to pass through the current sensor 180, and the AC busbar 802a is connected thereto as illustrated in FIG. 19. In the current sensor 180, a sensor core 51 formed by a magnetic material is disposed, and the AC busbar 805a is disposed so as to pass through the center of the sensor core 51. In a gap 52 of the sensor core 51 disposed so as to surround the AC busbar 805a, a Hall sensor 53 is arranged. The Hall sensor 53 detects the intensity of the magnetic field in the portion of the gap 52.

Since the relative permeability of the sensor core 51 formed by a magnetic material is higher than that of the air (relative permeability=1), and lines of magnetic flux around the AC busbar 805a are concentrated so as to be confined inside the sensor core 51. As a result, the magnetic flux density becomes high in the gap 52, and the sensitivity of the sensor is improved. A signal output from the Hall sensor 53 is amplified and detected by a detection circuit 54. The detection circuit 54 is disposed in the control circuit board 20.

As above, inside the current sensor 180, the sensor core 51 is disposed for each one of the busbars 805a to 805c, and accordingly, as illustrated in FIG. 32, the magnetic flux leaking from the part of the current sensor 180 is very small. Accordingly, in a case where the above-described AC busbars 802a to 802c are arranged in the opening portion 113, when the portion in which the current sensor 180 is arranged is configured to be located right below the opening portion 113, the effect of an electromagnetic noise due to the noise current flowing through the AC busbars 802a to 802c can be suppressed.

According to the above-described embodiment, the following operations and advantages are acquired.
(1) There is provided a power inverter including: a power semiconductor module 300 that includes a power semiconductor device inverting a DC current into an AC current; a control circuit board 20 that outputs a control signal used for controlling the power semiconductor device; a driver circuit board 22 that outputs a driving signal used for driving the power semiconductor device based on the control signal; a conductive metal base plate 11 arranged in a space between the driver circuit board 22 and the control circuit board 20 in which a fine and long opening portion 113 is formed; a wiring 115 that connects the driver circuit board 22 and the control circuit board 20 through the opening portion 113 and delivers the control signal to the driver circuit board 22; and an AC busbar 802 that is arranged on a side opposite to the metal base plate 11 through the driver circuit board 22 and delivers an AC current output from the power semiconductor module 300 to a drive motor, and at least a portion of the AC busbar 802 that faces the opening portion 113 extends in a direction directly running in a longitudinal direction of the fine and long opening portion 113.

Since at least a portion of the AC busbar 802 that faces the opening portion 113 extends in a direction directly running in the longitudinal direction of the fine and long opening portion 113, the length of a path of an induced current detour path that is parallel to a noise current when the induced current flowing through the metal base plate 11 bypasses the opening portion 113 is shortened. As a result, a magnetic field leaking from the opening portion 113 to the control circuit board 20 can be reduced, whereby a noise generated in the control circuit board 20 can be reduced. In addition, in the above-described embodiment, as the metal base plate 11, the base plate may not be formed using metal as long as it has conductivity.
(2) The AC busbar 802 may be configured by a U-phase AC busbar 802a, a V-phase AC busbar 802b, and a W-phase AC busbar 802c used for allowing a three phase current to flow, and the U-phase AC busbar 802a, the V-phase AC busbar 802b, and the W-phase AC busbar 802c may be formed such that at least portions facing the opening portion 113 are parallel to each other. By employing such a configuration, when a noise current flows through the AC busbar, an induced current is generated in another AC busbar parallel thereto, and the magnetic field according to the noise current and the magnetic field according to the induced current offset each other. As a result, the electromagnetic noise in the opening portion 113 can be reduced.

Figure 33:
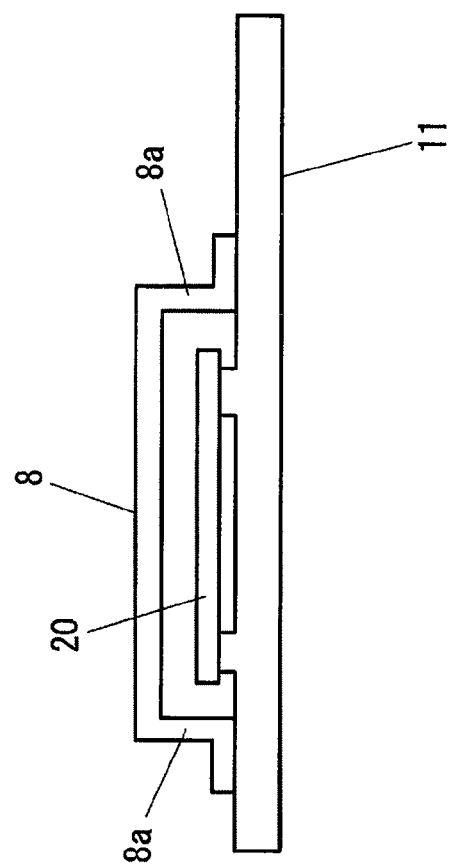
FIG. 33 is a diagram that illustrates a modified example of the cover 8.
Figure 34:
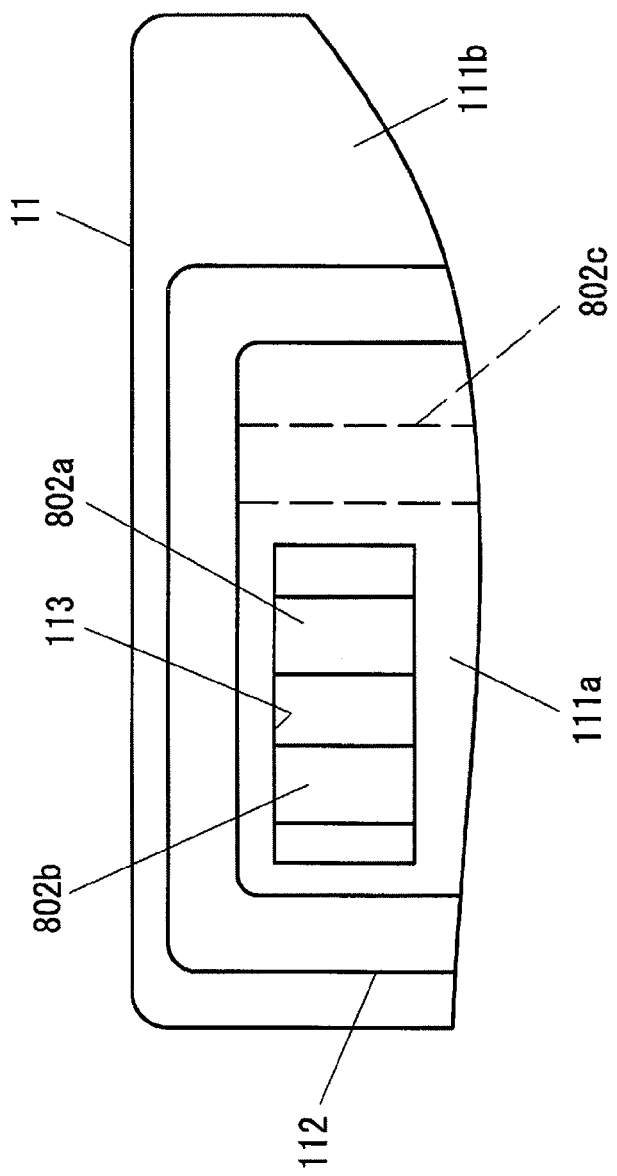
FIG. 34 is a diagram that illustrates a case where the two AC busbars 802a and 802b face the opening portion 113.

In addition, in the example described above, although three AC busbars are arranged on the lower side of the opening portion 113 due to a long length of the opening portion 113, in a case where the length of the opening portion 113 is relatively short, as illustrated in FIG. 34, two AC busbars 802a and 802b may be configured to face the opening portion 113.
(3) In addition, a sensor unit that includes a sensor core 51 made of a magnetic material through which the AC busbar 805a passes and a Hall sensor 53 detecting a magnetic flux density of the sensor core 51 may include current sensors 180 disposed for the U-phase, V-phase, and W-phase AC busbars, and the current sensors 180 may be disposed at positions facing the opening portion 113. The lines of magnetic fluxes formed concentrically around the AC busbar 805a through which the noise current flows are concentrated inside the sensor core 51, and the leakage to the opening portion 113 decreases, whereby the influence of the noise can be suppressed.
(4) A conductive casing 10 of a bottomed cylinder shape that has a casing opening portion closed by one face of the metal base plate 11 and forms a housing space in which the driver circuit board 22 is arranged and a conductive cover body 8 that is fixed to the other face of the metal base plate 11 and forms a housing space in which the control circuit board 20 is arranged between the metal base plate 11 and the cover body may be further included, and the metal base plate 11 may be fixed to the casing 10 such that the one face is brought into contact with a circumferential edge of the casing opening portion. By employing such a configuration, an electromagnetic noise of the control circuit board 20 transmitted from the driver circuit board 22 side and an electromagnetic noise penetrating into the control circuit board 20 and the driver circuit board 22 from the outside can be reduced. In addition, in the above-described embodiment, although the wall portion 112 is formed in the metal base plate 111, and the cover 8 is fixed to the wall portion 112, as illustrated in FIG. 33, a wall portion 8a may be formed on the cover 8 side.
(5) It is preferable that a connector 21 that includes a lead wiring 211 used for being connected to the control circuit board 20 be included, and the connector 21 be arranged such that the lead wiring 211 is connected to the control circuit board 20 through a space between the control circuit board 20 and the metal base plate 11. As a result, the influence of a noise on the lead wiring 211 can be reduced.
(6) As illustrated in FIG. 26, the opening portion 113 may be arranged at a position facing one edge of the control circuit board 20, and the connector 21 may be disposed on an edge located on a side opposite to the one edge of the control circuit board 20, and, by employing such a configuration, the influence of the electromagnetic noise leaking from the opening portion 113 on the connector 21 can be reduced.
(7) A wall portion 112 surrounding a periphery of the control circuit board 20 is integrally formed in the metal base plate 11, and a housing space in which the control circuit board 20 is arranged is formed by fixing the cover 8 to an upper end of the wall portion 112. By forming the wall portion 112 to be integrated with the metal base plate 11, a noise penetrating from the wall portion 112 can be easily let out through the metal base plate 11.

(8) In addition, by forming a notch portion 112a to which the connector 21 is fitted in the wall portion 112, the strength of the connector 21 at the time of receiving an external force can be improved.

(9) A connector 21 that is electrically connected to the control circuit board 20, AC terminals 822a to 822c to which the AC busbars 802a to 802c are connected, DC terminals 900a and 900b that are used for supplying the DC current to the power semiconductor module 300 are included, the DC terminals 900a and 900b and the AC terminals 822a to 822c are arranged on a side face of one side of the casing 10, and the connector 21 is arranged on a side face located on a side opposite to the side face of the casing 10. By employing such a configuration, the influence of noises generated in the AC terminals 822a to 822c and the DC terminals 900a and 900b on the connector 21 can be reduced.

(10) In addition, DC busbars 902a and 902b that are connected to the DC terminals inside the casing 10 are included, and, by configuring an extending direction of the DC busbars 902a and 902b extending from the DC terminals to be parallel to an extending direction of the AC busbars 802a to 802c extending from the AC terminals, a magnetic field according to the AC busbars 802a to 802c and a magnetic field according to the DC busbars 902a and 902b offset each other, whereby the influence of the noise can be reduced.

(11) In addition, it is preferable that DC busbars 902a and 902b that supply the DC current to the power semiconductor module 300 be included, and the metal base plate 11 closing the casing opening portion includes a base portion 11a (first base plate area) closing a part of the casing opening portion and a second base portion 111b (second base plate area) closing the other part is included, the control circuit board 20 is arranged so as to face a cover 8 side face of the base portion 11a, the driver circuit board 22 is arranged so as to face a casing-side face of the base portion 11a, and the DC busbars 902a and 902b are arranged so as to face a casing-side face of the base portion 111b. Accordingly, direct arrival of noises from the DC busbars 902a and 902b to the opening portion 113 can be reduced, whereby the influence of the noises of the DC busbars 902a and 902b on the control circuit board 20 can be reduced. In addition, since the DC busbars 902a and 902b are surrounded by the conductive metal base plate 11 and the conductive casing 10, noises leaking from the DC busbars 902a and 902b can be reduced as well.

The above-described embodiments may be used in a separate manner or a combined manner. The reason for this is that the advantages of each embodiment can be acquired separately or in an augmented manner. In addition, the present invention is not limited to the above-described embodiments as long as the features of the present invention are not taken away.

The entire contents of the following application on which priority is based are incorporated herein by reference. Japanese Patent Application 2010-289948 (Filed on Dec. 27, 2010)

The invention claimed is:

1. A power inverter comprising:
    a power module that includes a power semiconductor device inverting a DC current into an AC current;
    a control circuit board that outputs a control signal used for controlling the power semiconductor device;
    a driver circuit board that outputs a driving signal used for driving the power semiconductor device based on the control signal;
    a conductive base plate arranged in a space between the driver circuit board and the control circuit board in which a wiring opening portion is formed;
    a control wiring that connects the driver circuit board and the control circuit board through the wiring opening portion and delivers the control signal to the driver circuit board;
    a conductive casing of a bottomed cylinder shape that has a casing opening potion closed by one face of the base plate and forms a housing space in which the driver circuit board is arranged;
    a conductive cover body that is fixed to the other face of the base plate and forms a housing space in which the control circuit board is arranged between the base plate and the cover body; and
    an external connector that includes a lead wiring used for being connected to the control circuit board;
    wherein the base plate is fixed to the casing such that the one face is brought into contact with a circumferential edge of the casing opening portion;
    the external connector is arranged such that the lead wiring is connected to the control circuit board through a space between the control circuit board and the base plate;
    a wall portion surrounding a periphery of the control circuit board is integrally formed on the base plate; and
    a housing space in which the control circuit board is arranged is formed by fixing the cover body to an upper end of the wall portion.

2. The power inverter according to claim 1, further comprising an AC busbar, wherein
    the AC busbar is configured by a U-phase AC busbar, a V-phase AC busbar, and a W-phase AC busbar used for allowing a three phase current to flow, and
    the U-phase AC busbar, the V-phase AC busbar, and the W-phase AC busbar are formed such that at least portions facing the wiring opening portion are parallel to each other.

3. The power inverter according to claim 2, wherein
    a sensor unit, which includes a magnetic core through which the AC busbar passes and a detection device detecting a magnetic flux density of the magnetic core, includes current sensors disposed for the U-phase, V-phase, and W-phase AC busbars, and
    the current sensors are disposed at positions facing the wiring opening portion.

4. The power inverter according to claim 1, wherein the wiring opening portion is arranged at a position facing one edge of the control circuit board, and the external connector is disposed on an edge located on a side opposite to the one edge of the control circuit board.

5. The power inverter according to claim 1, wherein a notch portion to which the external connector is fitted is formed on the wall portion.

6. The power inverter according to claim 1, further comprising:
    an external connector that is electrically connected to the control circuit board;
    an AC terminal to which the AC busbar is connected; and
    a DC terminal that is used for supplying the DC current to the power module, wherein
    the DC terminal and the AC terminal are arranged on a side face of one side of the casing, and
    the external connector is arranged on a side face located on a side opposite to the side face of the casing.

7. The power inverter according to claim 6, further comprising:

a DC busbar that is connected to the DC terminal inside the casing, wherein
an extending direction of the DC busbar extending from the DC terminal is parallel to an extending direction of the AC busbar extending from the AC terminal.

8. The power inverter according to claim 1, further comprising:

a DC busbar that supplies the DC current to the power module, wherein the base plate that closes the casing opening portion includes a first base plate area closing a part of the casing opening portion and a second base plate area closing the other part, the control circuit board is arranged so as to face a cover body-side face of the first base plate area, the driver circuit board is arranged so as to face a casing-side face of the first base plate area, and the DC busbar is arranged so as to face a casing-side face of the second base plate area.

* * * * *